US012597460B2

(12) United States Patent
Wang et al.

(10) Patent No.: US 12,597,460 B2
(45) Date of Patent: Apr. 7, 2026

(54) STORAGE DEVICE, METHOD FOR MANUFACTURING THE SAME, AND ELECTRONIC DEVICE INCLUDING STORAGE DEVICE

(71) Applicants: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

(72) Inventors: Qi Wang, Beijing (CN); Huilong Zhu, Poughkeepsie, NY (US)

(73) Assignees: BEIJING SUPERSTRING ACADEMY OF MEMORY TECHNOLOGY, Beijing (CN); INSTITUTE OF MICROELECTRONICS, CHINESE ACADEMY OF SCIENCES, Beijing (CN)

( * ) Notice: Subject to any disclaimer, the term of this patent is extended or adjusted under 35 U.S.C. 154(b) by 306 days.

(21) Appl. No.: 18/548,035

(22) PCT Filed: Nov. 26, 2021

(86) PCT No.: PCT/CN2021/133337
§ 371 (c)(1),
(2) Date: Aug. 25, 2023

(87) PCT Pub. No.: WO2023/087363
PCT Pub. Date: May 25, 2023

(65) Prior Publication Data
US 2024/0135986 A1      Apr. 25, 2024
US 2024/0233810 A9      Jul. 11, 2024

(30) Foreign Application Priority Data

Nov. 19, 2021    (CN) .......................... 202111381851.1

(51) Int. Cl.
G11C 8/00        (2006.01)
G11C 11/408      (2006.01)
G11C 11/4097     (2006.01)

(52) U.S. Cl.
CPC ...... *G11C 11/4085* (2013.01); *G11C 11/4097* (2013.01)

(58) Field of Classification Search
CPC ........................ G11C 11/4085; G11C 11/4097
(Continued)

(56) References Cited

U.S. PATENT DOCUMENTS 7,034,408 B1      4/2006 Schloesser
11,532,636 B2 *  12/2022 Guo .................... H01L 23/5283
(Continued)

FOREIGN PATENT DOCUMENTS

CN          1815718 A        8/2006
CN        107017264 A        8/2017
(Continued)

OTHER PUBLICATIONS

International Search Report and Written Opinion dated Aug. 16, 2022, for corresponding PCT Application No. PCT/CN2021/133337.

*Primary Examiner* — Viet Q Nguyen
(74) *Attorney, Agent, or Firm* — Kinney & Lange, P.A.

(57) ABSTRACT

A storage device is provided, including: a substrate; word lines extending in a first direction; bit lines extending in a second direction perpendicular to the first direction; and a storage unit including a plurality of storage units, each of which is electrically connected to a word line and a bit line. Each storage unit includes: an active region extending in a (Continued)

third direction inclined with the first direction; a vertical stack of a first source/drain layer, a channel layer and a second source/drain layer; and gate stacks between the first source/drain layer and the second source/drain layer, and on opposite sides of the channel layer in a fourth direction orthogonal to the third direction, to sandwich the channel layer. The word line corresponding to each storage unit extends across the storage unit in the first direction to be electrically connected to the gate stacks on opposite sides.

18 Claims, 18 Drawing Sheets

(58) Field of Classification Search
USPC ...................................................... 365/230.06
See application file for complete search history.

(56) References Cited

U.S. PATENT DOCUMENTS

| | | | | |
|---|---|---|---|---|
| 11,563,022 | B2 * | 1/2023 | Xu | H10B 43/27 |
| 11,616,422 | B2 * | 3/2023 | Nagai | G07C 5/0816 |
| | | | | 310/68 R |
| 11,637,120 | B2 * | 4/2023 | Kim | H10B 69/00 |
| | | | | 257/314 |
| 11,682,667 | B2 * | 6/2023 | Yamazaki | H10D 84/83 |
| | | | | 257/401 |
| 11,682,668 | B2 * | 6/2023 | Parikh | H10D 84/0151 |
| | | | | 257/401 |
| 11,910,614 | B2 * | 2/2024 | Lee | H10B 43/50 |
| 11,983,622 | B2 * | 5/2024 | Obradovic | H10D 30/681 |
| 12,052,871 | B2 * | 7/2024 | Xia | H10B 43/10 |
| 12,094,935 | B2 * | 9/2024 | Liao | H01L 21/32 |
| 12,266,417 | B2 * | 4/2025 | Li | H10B 61/00 |
| 2006/0120129 | A1 | 6/2006 | Schloesser | |
| 2012/0119287 | A1 * | 5/2012 | Park | H10D 84/038 |
| | | | | 257/329 |
| 2013/0234242 | A1 | 9/2013 | Hwang | |
| 2014/0035019 | A1 | 2/2014 | Lee | |
| 2018/0097065 | A1 | 4/2018 | Zhu | |
| 2019/0074363 | A1 | 3/2019 | Zhu | |
| 2021/0143163 | A1 * | 5/2021 | Leobandung | H10D 62/83 |

FOREIGN PATENT DOCUMENTS

| | | | |
|---|---|---|---|
| CN | 109285836 | A | 1/2019 |
| CN | 109285838 | A | 1/2019 |
| CN | 109461738 | A | 3/2019 |
| CN | 109560087 | A | 4/2019 |
| CN | 110634870 | A | 12/2019 |
| CN | 112018111 | A | 12/2020 |
| CN | 212136451 | U | 12/2020 |
| CN | 112909015 | A | 6/2021 |
| KR | 20080082353 | A | 9/2008 |
| KR | 20230016320 | A | 2/2023 |

* cited by examiner

1015

1007

1015

1007

1005

1003

1001

A              A'

STORAGE DEVICE, METHOD FOR MANUFACTURING THE SAME, AND ELECTRONIC DEVICE INCLUDING STORAGE DEVICE

CROSS-REFERENCE TO RELATED APPLICATION

The present application is a Section 371 National Stage Application of International Application No. PCT/CN2021/133337, filed on Nov. 26, 2021, entitled "STORAGE DEVICE, METHOD FOR MANUFACTURING THE SAME, AND ELECTRONIC DEVICE INCLUDING STORAGE DEVICE," which claims priority to Chinese Patent Application No. 202111381851.1, titled "STORAGE DEVICE, METHOD FOR MANUFACTURING THE SAME, AND ELECTRONIC DEVICE INCLUDING STORAGE DEVICE", filed on Nov. 19, 2021, incorporated herein by reference in their entirety.

TECHNICAL FIELD

The present disclosure relates to a field of semiconductors, in particular to a storage device, a method for manufacturing the same, and an electronic device including the storage device.

BACKGROUND

In order to meet a demand for larger storage capacity, an integration of the storage devices is getting higher and higher, and a size of the storage unit is further reduced. Such size reduction is accompanied by an increase in a leakage current, especially for a horizontal device.

SUMMARY

To this end, the present disclosure at least partially provides a storage device capable of suppressing a leakage current while guaranteeing a magnitude of an on-current, a method for manufacturing the same, and an electronic device including the storage device.

According to an aspect of the present disclosure, there is provided a storage device, including: a substrate; a plurality of word lines extending in a first direction on the substrate; a plurality of bit lines extending in a second direction perpendicular to the first direction on the substrate; a storage unit array disposed on the substrate, where the storage unit array includes a plurality of storage units, each of which is electrically connected to a respective one of the plurality of word lines and a respective one of the plurality of bit lines. Each storage unit includes: an active region, where the active region extends in a third direction inclined with respect to the first direction and includes a vertical stack of a first source/drain layer, a channel layer and a second source/drain layer; and gate stacks between the first source/drain layer and the second source/drain layer in a vertical direction, where the gate stacks are disposed on opposite sides of the channel layer in a fourth direction orthogonal to the third direction, so as to sandwich the channel layer. The word line corresponding to each storage unit extends across the storage unit in the first direction to be in contact with and electrically connected to the gate stacks on opposite sides of the storage unit.

According to another aspect of the present disclosure, there is provided a method for manufacturing a storage device, including: providing a vertical stack extending in a third direction between a first direction and a second direction on a substrate, where the vertical stack includes a first source/drain layer, a channel layer and a second source/drain layer stacked sequentially, and the first direction and the second direction is perpendicular to each other; dividing the vertical stack into a plurality of segments in the third direction; defining a plurality of storage units based on the plurality of segments; forming a plurality of word lines extending in the first direction on the substrate, where each of the word lines extends across a respective storage unit of the plurality of storage units in the first direction and is electrically connected to gate stacks of the respective storage unit; forming a plurality of bit lines extending in the second direction on the substrate, where each of the bit lines is electrically connected to a respective storage unit of the plurality of storage units.

According to another aspect of the present disclosure, there is provided an electronic device including the storage device described above.

According to embodiments of the present disclosure, when the storage unit is manufactured based on a vertical device, an area occupied by the storage unit may be reduced compared with a horizontal device. In addition, the on-current may be increased by optimizing an orientation of the active region of the device, especially an orientation of the channel layer.

BRIEF DESCRIPTION OF THE DRAWINGS

The above and other objectives, features and advantages of the present disclosure will be more apparent through the following the descriptions of embodiments of the present disclosure with reference to the accompanying drawings.

FIG. 1(a) to FIG. 23 schematically show some stages in a process of manufacturing a storage device according to embodiments of the present disclosure.

FIG. 1(a), FIG. 2(a), FIG. 3(a), FIG. 8(a), FIG. 12, FIG. 13(a), FIG. 14, FIG. 15(a), FIG. 16(a), FIG. 18, FIG. 19(a), FIG. 20(a), FIG. 21(a), FIG. 22(a), and FIG. 23 are top views, where FIG. 2(a) shows a position of the line AA', FIG. 13(a) shows a position of the line BB', FIG. 15(a) shows a position of the line CC', FIG. 19(a) shows a position of the line DD' and a position of the line EE', FIG. 20(a) shows a position of line FF', and FIG. 22(a) shows a position of the line GG'.

FIG. 2(b), FIG. 3(b), FIG. 4 to FIG. 7, FIG. 8(b), FIG. 9 to FIG. 11, FIG. 13(b), FIG. 16(b), and FIG. 17 show sectional views taken along the line AA'.

Throughout the drawings, the same or similar reference numerals represent the same or similar components. The accompanying drawings are not necessarily drawn to scale, and especially for the sake of clarity, the drawing scale of the sectional views is different from that of the top views.

DETAILED DESCRIPTION OF EMBODIMENTS

Figure 1A:
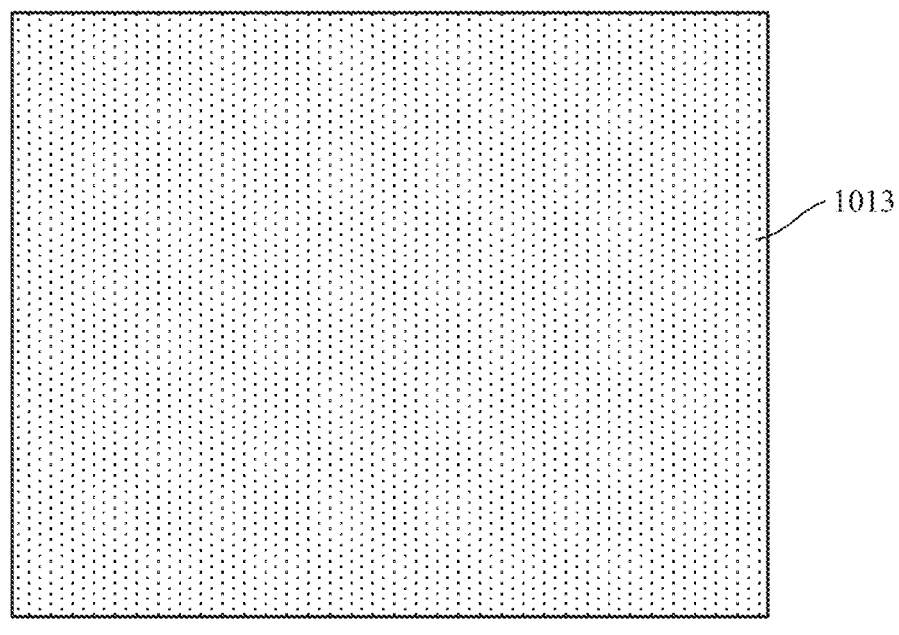

Embodiments of the present disclosure will be described below with reference to the accompanying drawings. However, it should be understood that these descriptions are merely exemplary and are not intended to limit the scope of the present disclosure. In addition, in the following descriptions, descriptions on well-known structures and technologies are omitted to avoid unnecessarily obscuring concepts in the present disclosure.

Various schematic structural diagrams according to the embodiments of the present disclosure are shown in the accompanying drawings. The drawings are not drawn to scale. Some details are enlarged and some details may be omitted for clarity of presentation. Shapes of various regions and layers as well as the relative size and positional relationship thereof shown in the drawings are only exemplary. In practice, there may be deviations due to manufacturing tolerances or technical limitations, and those skilled in the art may additionally design regions/layers with different shapes, sizes and relative positions according to actual needs.

In the context of the present disclosure, when a layer/element is referred to as being "on" another layer/element, the layer/element may be directly on the other layer/element, or there may be an intermediate layer/element between them. In addition, if a layer/element is located "on" another layer/element in one orientation, the layer/element may be located "under" the other layer/element when the orientation is reversed.

According to embodiments of the present disclosure, there is provided a storage device. The storage device is based on a vertical metal oxide field effect transistor (MOSFET). Compared with a horizontal MOSFET, a vertical MOSFET may occupy a smaller space and have a smaller leakage current, but may also have a smaller on-current. According to the idea of the present disclosure, the on-current of the vertical MOSFET may be optimized by adjusting an orientation of the vertical MOSFET, such as an angle with respect to a bit line (or a word line), and a magnitude of the on-current may be therefore guaranteed while suppressing the leakage current.

The on-current of the vertical MOSFET may be in a vertical direction (e.g., in a direction substantially perpendicular to a surface of a substrate). For example, the vertical MOSFET may include a vertical stack of a first source/drain layer, a channel layer, and a second source/drain layer. A gate stack may be disposed facing the channel layer to define a channel region in the channel layer. Source/drain regions may be formed in the first source/drain layer and the second source/drain layer respectively, and may be electrically connected to each other through the channel region. One of the source/drain regions may be electrically connected to a data storage structure, such as a capacitor, and thus form a storage unit (e.g., a Dynamic Random Access Memory (DRAM) configuration may be obtained). The other of the source/drain regions may be electrically connected to a bit line (BL), and the gate stack may be electrically connected to a word line (WL). The storage unit may be addressed through the word line and the bit line.

As described above, an orientation of the vertical stack (especially the channel layer therein) may be optimized to increase the on-current. For example, the vertical stack may be inclined with respect to the WL (or the BL), e.g., at an angle approximately in a range of 30 degrees to 80 degrees, so as to increase a channel width and therefore increase the on-current. In addition, the orientation of the vertical stack, especially the orientation of the channel layer therein, may be arranged along a specific crystal face in which carriers may have a large mobility, for example, electrons on the (100) crystal face may have a large mobility.

According to the embodiments, the WL may extend in a first direction, the BL may extend in a second direction intersecting (e.g., perpendicular to) the first direction, and the vertical stack (especially the channel layer therein) may extend in a third direction between the first direction and the second direction.

Gate stacks may be arranged on two opposite sides of the channel layer (in a fourth direction orthogonal to the third direction), so that a double-gate structure may be obtained. The WL may extend across the vertical stack in the first direction, and may be in contact with the vertical stack and therefore electrically connected to the gate stacks on the opposite sides. According to the embodiments, the gate stacks (e.g., a gate conductor layer in the gate stack) and the WL may be formed integrally to simplify the process, thereby reducing the costs.

According to the embodiments, each pair of adjacent storage units in the third direction may share a same BL contact plug to save space. For example, the pair of storage units have first source/drain layers that extend towards each other so as to be integral with each other, and a common BL contact plug may be disposed in a region of a first source/drain layer between this pair of storage units.

The channel layer may include a single crystal semiconductor material. Also, the first source/drain layer and the second source/drain layer may include a single crystal semiconductor material. For example, they may be formed by way of epitaxial growth.

The semiconductor device may be manufactured, for example, as follows.

A vertical active region may be disposed on a substrate, such as the vertical stack of the first source/drain layer, the channel layer, and the second source/drain layer. As described above, the vertical stack may extend in the third direction between the first direction (e.g., a WL direction) and the second direction (e.g., a BL direction). There may be a plurality of such parallel vertical stacks. As described below, the vertical stack may be formed by using a spacer pattern transfer technique. The vertical stack may be divided into a plurality of segments in the third direction, and the storage unit may be defined based on these segments. Each storage unit may be electrically connected to a respective WL and a respective BL.

According to the embodiments of the present disclosure, two storage units may be defined based on one segment. For example, the second source/drain layer and the channel layer in a middle region of each segment in the third direction may be removed to expose the first source/drain layer, and portions of the segment on opposite sides of the middle region in the third direction may each define a storage unit. A bit line BL corresponding to the two storage units may be electrically connected to the two storage units through a common contact plug disposed on the first source/drain layer in the middle region. Certainly, the present disclosure is not limited thereto. For example, one storage unit may be defined based on one segment.

According to the embodiments of the present disclosure, the WL may be integral with and the gate stack (especially the gate conductor layer therein). For example, recessed portions are defined between the first source/drain layer and the second source/drain layer of each storage unit, where the recessed portions are located on opposite sides of the channel layer in a fourth direction orthogonal to the third direction. A gate dielectric layer and a gate conductor layer may be formed sequentially, and the recessed portion may be filled with the gate dielectric layer and the gate conductor layer, so that the gate stack is formed (and thus self-aligned with the channel layer). The gate conductor layer may be patterned into WLs extending in the first direction, and the patterning of the gate conductor layer may substantially have no effect on the gate conductor layer filled in the recessed portion.

According to the embodiments of the present disclosure, a thickness of the channel layer and a gate length of the channel layer (a nanosheet or a nanowire) may be mainly determined according to the epitaxial growth rather than an etching or photolithography process, so that it is possible to have a good channel size/thickness and a good gate length control.

The present disclosure may be presented in various forms, where some examples will be described below. In the following descriptions, selection of various materials is involved. In the selection of materials, in addition to a function of the material (e.g., a semiconductor material may be used to form the active region, and a dielectric material may be used to form an electrical isolation), the etching selectivity is also considered. In the following descriptions, a required etching selectivity may or may not be indicated. Those skilled in the art will understand that in the followings, if etching of a certain material layer is mentioned but etching of other layers is not, then the mentioned etching may be selective and the material layer may have an etching selectivity with respect to other layers exposed in the same etching recipe.

FIG. 1 to FIG. 23 schematically show some stages in a process of manufacturing a storage device according to embodiments of the present disclosure.

Figure 1B:
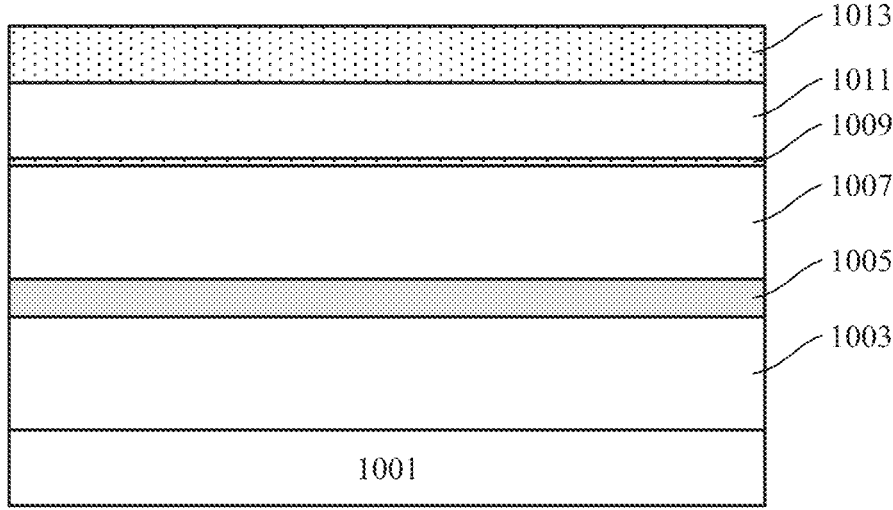
FIG. 1(b) shows a sectional view in a vertical direction.

As shown in FIG. 1(a) and FIG. 1(b), a substrate 1001 is provided. The substrate 1001 may be in various forms, including but not limited to a bulk semiconductor material substrate, such as a bulk Si substrate, a semiconductor-on-insulator (SOI) substrate, a compound semiconductor substrate such as a SiGe substrate. In the following descriptions, for ease of description, the bulk Si substrate is illustrated by way of example. Here, a silicon wafer is provided as the substrate 1001.

In the substrate 1001, a well region may be formed. If a p-type device is to be formed, the well region may be an n-type well; and if an n-type device is to be formed, the well region may be a p-type well. Generally, in the DRAM, the storage unit is based on the n-type device. For example, the p-type well may be formed by implanting a p-type dopant, such as boron (B), into the substrate 1001 and then performing a thermal annealing. For example, the ion implantation process may employ energy approximately in a range of 30 KeV to 300 KeV, a doping concentration approximately in a range of 1E12 to 1E14/cm$^2$, and an implantation angle approximately in a range of 0 to 15 degrees.

Hereinafter, a formation of the n-type device is illustrated by way of example. It is will be clear to those skilled in the art that the following description is also applicable to the p-type device by, for example, appropriately changing the conductive type of the dopant.

On the substrate 1001, a first source/drain layer 1003, a channel defining layer 1005, and a second source/drain layer 1007 may be formed by using, for example, an epitaxial growth process. The first source/drain layer 1003 may be used to define a position of the lower source/drain portion, and may have a thickness, for example, approximately in a range of 50 nm to 300 nm. The channel defining layer 1005 may be used to define a position of the channel, and may have a thickness, for example, approximately in a range of 30 nm to 150 nm. The second source/drain layer 1005 may be used to define a position of the upper source/drain portion, and may have a thickness, for example, approximately in a range of 50 nm to 250 nm.

Adjacent layers in the first source/drain layer 1003, the channel defining layer 1005, and the second source/drain layer 1007 may have an etching selectivity with respect to each other. For example, the first source/drain layer 1003 may include Si, the channel defining layer 1005 may include SiGe (an atomic percentage of Ge may be, for example, approximately in a range of 10% to 40%), and the second source/drain layer 1007 may include Si.

The first source/drain layer 1003 and the second source/drain layer 1007 may be doped in situ during their growth, so as to (at least partially) define doping characteristics of the source/drain portions. For example, an n-type dopant, such as phosphorus (P), may be doped at a concentration approximately in a range of 1E19 to 1E21/cm$^3$.

Subsequently, the active region may be defined by the first source/drain layer 1003, the channel defining layer 1005, and the second source/drain layer 1007. In order to avoid the photolithography limitation, according to the embodiments of the present disclosure, a spacer pattern transfer technique is used in the following patterning process. In order to form a spacer, a mandrel pattern may be formed. For example, a layer 1011 for forming the mandrel pattern may be formed on the second source/drain layer 1007 by using, for example, a deposition process, such as a Chemical Vapor Deposition (CVD) process. For example, the layer 1011 for forming the mandrel pattern may include amorphous silicon or polysilicon and have a thickness approximately in a range of 50 nm to 400 nm. In addition, in order to better control etching, an etching stop layer 1009 may be first formed by using, for example, a deposition process such as a CVD process. For example, the etching stop layer 1009 may contain an oxide (e.g., silicon oxide) and have a thickness approximately in a range of 5 nm to 30 nm.

On the layer 1011 for forming the mandrel pattern, a hard mask layer 1013 may be formed by using, for example, a deposition process such as a CVD process. For example, the hard mask layer 1013 may include an oxide and have a thickness approximately in a range of 50 nm to 400 nm.

The layer 1011 for the mandrel pattern may be patterned to form the mandrel pattern.

Figure 2A:
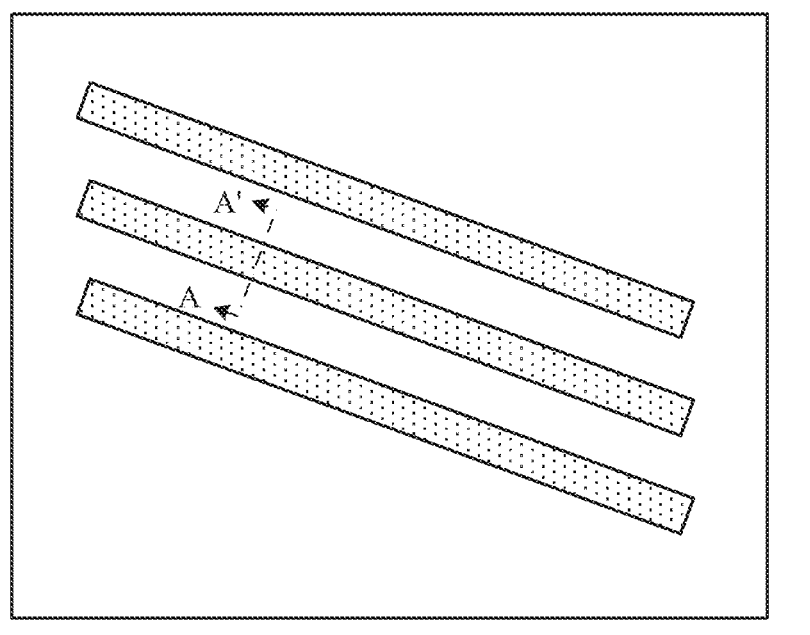
Figure 2A:
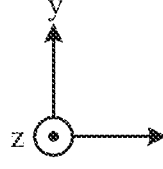
Figure 2B:
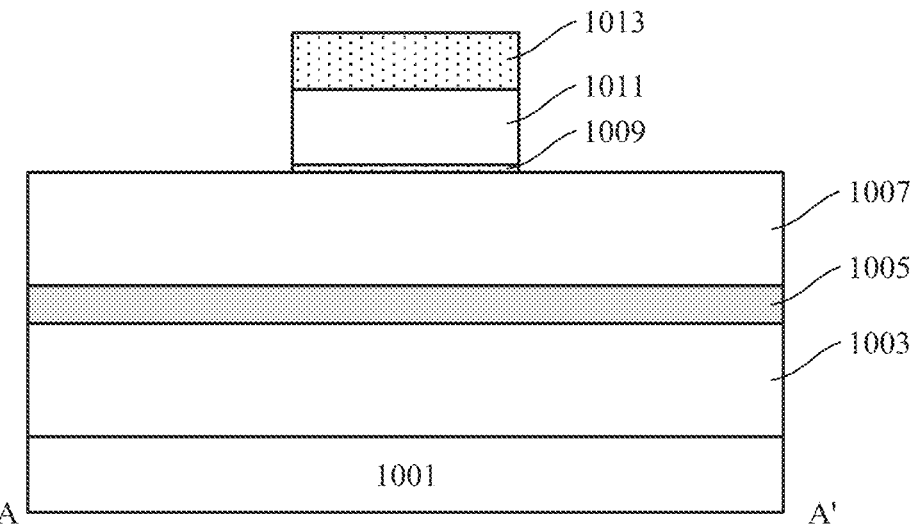

For example, as shown in FIG. 2(a) and FIG. 2(b), a patterned photoresist (not shown) may be formed on the hard mask layer 1013 by using a photolithography process (where a layout critical dimension (CD) may be approximately in a range of 20 nm to 60 nm). A photoresist (not shown) is formed on the hard mask layer 1013. The patterned photoresist may be used as an etching mask, and the hard mask layer 1013, the layer 1011 for forming the mandrel pattern, and the etching stop layer 1009 may be selectively etched sequentially by using, for example, reactive ion etching (RIE) processes. The RIE process may be performed in the vertical direction, the RIE process for the layer 1011 for forming the mandrel pattern may be stopped at the etching stop layer 1009, and the RIE process for the etching stop layer 1009 may be stopped at the second source/drain layer 1007. After that, the photoresist may be removed.

FIG. 2 (*a*) schematically shows lateral directions x and y, and a vertical direction z. The x and y directions may be parallel to a top surface of the substrate 1001, and may intersect with each other, e.g., the x and y directions may be perpendicular to each other. The z direction may be substantially perpendicular to the top surface of the substrate 1001. The y direction may correspond to a longitudinal extension direction (which may be referred to as a "first direction") of a subsequently formed word line (WL), and the x direction may correspond to a longitudinal extension direction (which may be referred to as a "second direction") of a subsequently formed bit line (BL).

Here, in order to form a storage unit array, the mandrel pattern (still denoted by 1011 for ease of description) includes a series of line segments extending substantially parallel to one another. The line segments may be inclined with respect to the y direction (i.e., at a non-orthogonal angle). For example, a longitudinal extension direction of the line segment (which may be referred to as a "third direction") may be at an angle approximately in a range of 30 to 80 degrees with respect to the y direction. In addition, the longitudinal extension direction of the line segment may be set along a specific crystal face, such as the (100) crystal face, so as to improve a mobility of carriers (which are electrons in the case of the n-type device).

Figure 3A:
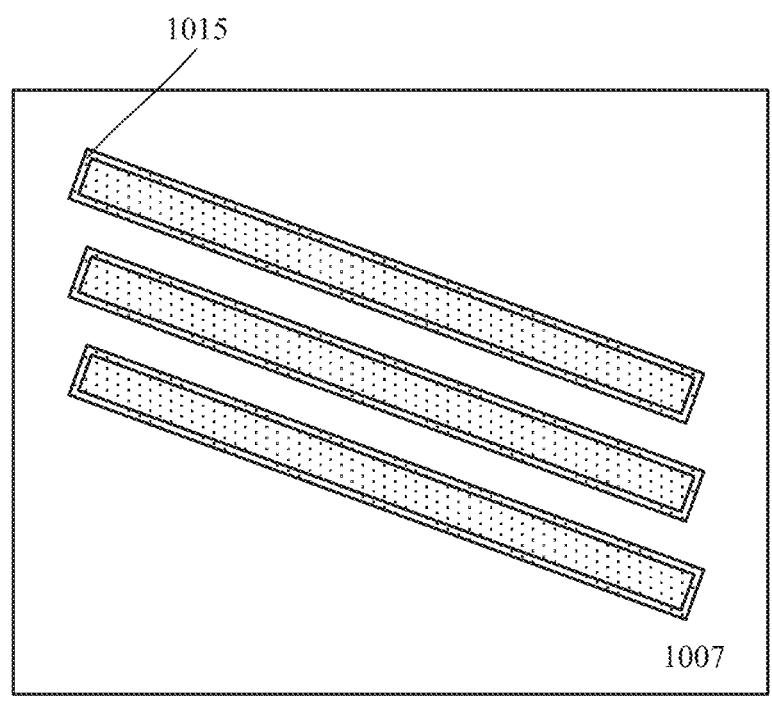
Figure 3B:
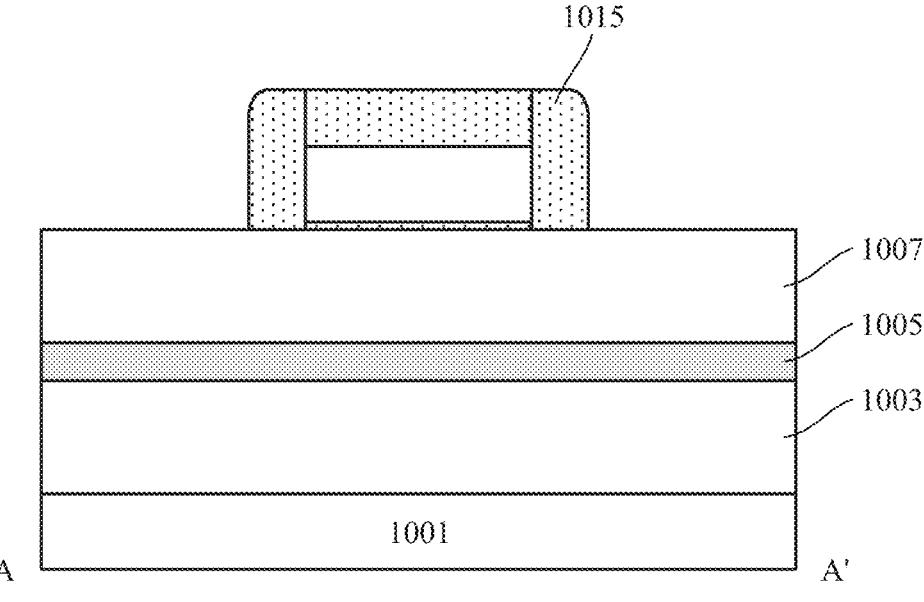

As shown in FIG. 3(*a*) and FIG. 3(*b*), a spacer 1015 may be formed on a sidewall of the mandrel pattern 1011. For example, a substantially conformal oxide may be deposited, and then an anisotropic etching process, such as an RIE process, may be performed on the deposited oxide layer along the z direction, to remove a lateral extension portion of the deposited oxide layer and retain a vertical extension portion of the deposited oxide layer, so as to obtain the spacer 1015. The spacer 1015 may then be used to define a position of the active region of the device. The spacer 1015 may have a thickness approximately in a range of 30 nm to 200 nm (in the lateral direction).

Figure 4:
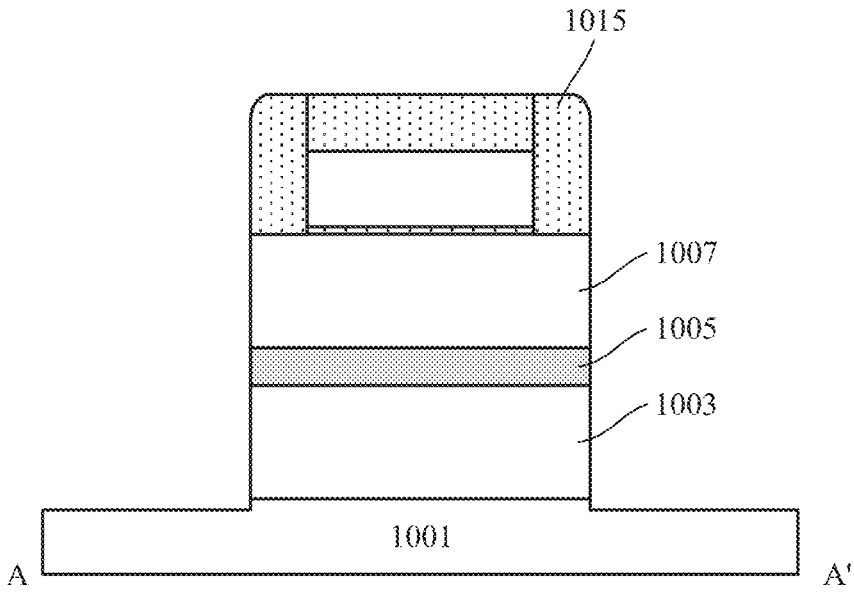

As shown in FIG. 4, the second source/drain layer 1007, the channel defining layer 1005 and the first source/drain layer 1003 may be patterned into ridge structures corresponding to parallel strip patterns of the mandrel pattern 1011 by using the hard mask layer 1013 and the spacer 1015. For example, the hard mask layer 1013 and the spacer 1015 may be used as the etching mask to selectively etch the respective layers sequentially by using, for example, RIE processes in the z direction, so as to transfer the pattern to lower layers. Here, an over-etching of the substrate 1001 may occur, and an over-etching depth is, for example, approximately in a range of 10 nm to 100 nm.

Figure 5:
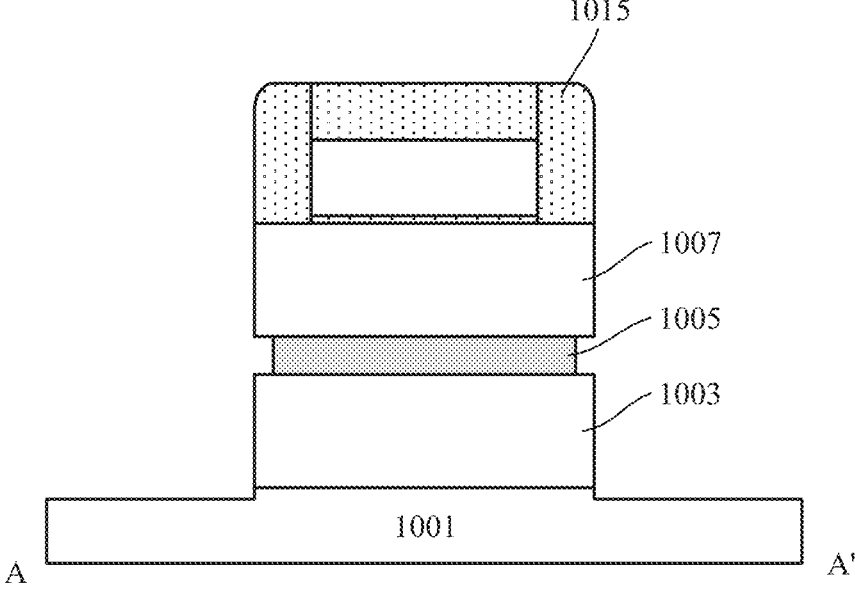

A certain space may be formed between the first source/drain layer 1003 and the second source/drain layer 1007, so that the subsequently formed gate stack may be (at least partially) disposed in the space, and the gate stack may be self-aligned to the channel portion defined by the channel defining layer 1005. For example, as shown in FIG. 5, the channel defining layer 1005 may be selectively etched, so that sidewalls of the channel defining layer 1005 may be oppositely recessed in the lateral direction, for example, in a fourth direction (which is a horizontal direction in the paper plane in FIG. 5) orthogonal to a third direction (which is a direction perpendicular to the paper plane in FIG. 5), so as to form the recessed portions. For example, for the selective etching, a mixed gas of CF$_4$, O$_2$ and He with a (volume) ratio of 4:1:5 may be used (which is dry etching), or a mixed solution of HF (which is an aqueous solution with a concentration of 6%), H$_2$O$_2$ (which is an aqueous solution with a concentration of 30%) and CH$_3$COOH (which is an aqueous solution with a concentration of 99.8%) with a (volume) ratio of 1:2:4 may be used (which is wet etching), and a lateral etching amount may be approximately in a range of 10 nm to 100 nm.

In an example shown in FIG. 5, after the etching, the sidewall of the channel defining layer 1005 remains substantially vertical. Depending on conditions of the etching process, the sidewall of the channel defining layer 1005 after etching may be in a curved shape, such as a C-shape.

Figure 6:
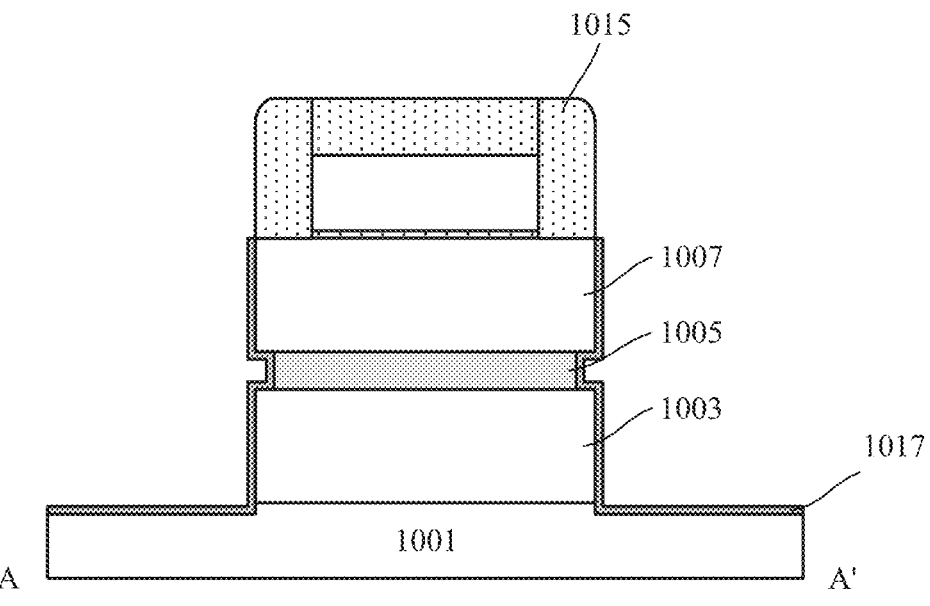

As shown in FIG. 6, an active layer 1017 may be formed on a sidewall of the ridge structure by using, for example, a selective epitaxial growth process. Due to the selective epitaxial growth, the active layer 1017 may not be formed on the surfaces of the hard mask layer 1013 and the spacer 1015. A portion of the active layer 1017 on the sidewall of the channel defining layer 1005 then faces the gate stack, and thus defines the channel portion. The channel portion extends substantially in the vertical direction, thus the active layer 1017 (especially the portion of active layer 1017 on the sidewall of the channel defining layer 1005) may also be referred to as a (vertical) channel layer. According to the embodiments of the present disclosure, a thickness of the active layer 1017 (defining the channel portion) may be determined through the epitaxial growth process (for example, the thickness is approximately in a range of 5 nm to 50 nm), and thus a thickness of the channel portion may be better controlled.

Although the selective epitaxial growth is used here, a non-selective epitaxial growth is also applicable.

A material of the active layer 1017 may be appropriately selected according to the performance requirements of the device during design. For example, the active layer 1017 may include various semiconductor materials, for example, an elemental semiconductor material, such as Si and Ge, or a compound semiconductor material, such as, SiGe, InP, GaAs, and InGaAs. In this example, the active layer 1017 may include Si, which is the same as the first source/drain layer and the second source/drain layer.

In addition, the active layer 1017 may be (lightly) doped in situ during its grown, so as to form a certain doping distribution in the channel portion to adjust a threshold voltage (Vt) of the device.

Figure 7:
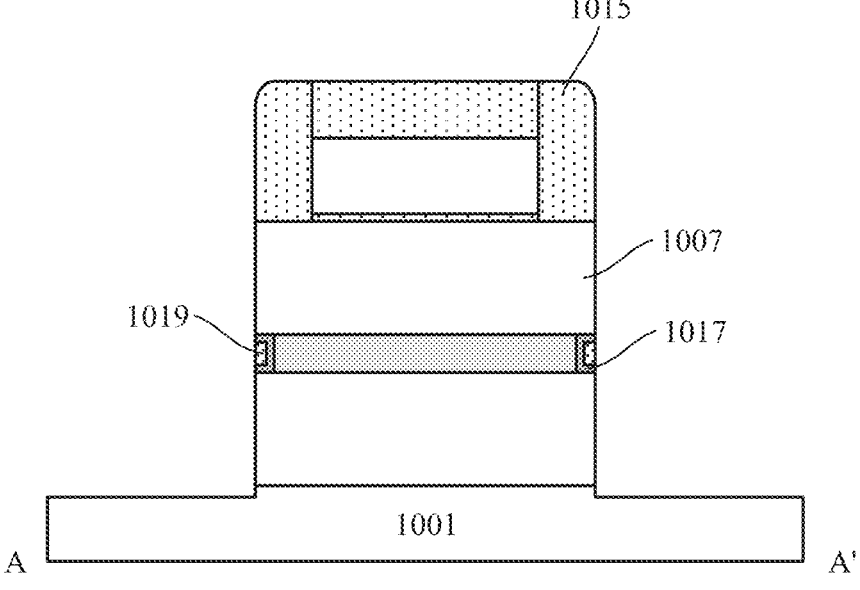

The gate stack may be subsequently formed in the recessed portions. In order to prevent unwanted material from being left in the recessed portions or affecting the active layer 1017 in a subsequent processing, as shown in FIG. 7, a position retaining layer 1019 may be formed in the recessed portions. For example, a low-pressure CVD which provides a good step coverage may be used to deposit a nitride (e.g., silicon nitride) with a thickness approximately in a range of 10 nm to 100 nm. Then, the hard mask layer 1013 and the spacer 1015 may be used as an etching mask to etch back the deposited nitride by, for example, an RIE process in the z direction, to form the position retaining layer 1019 filled in the recessed portion. A portion of the active layer 1017 outside the recessed portion may also be removed (or may be removed by using an additional RIE process).

As a supplement or alternative to the above in-situ doping of the first source/drain layer 1003 and the second source/drain layer 1007, the first source/drain layer 1003 and the second source/drain layer 1007 may be doped, so as to obtain a desired source/drain doping characteristic. The doping may be implemented by using an ion implantation process or a solid-phase dopant source layer. For example, a substantially conformal solid-phase dopant source layer (not shown) may be formed on a structure shown in FIG. 7 by using a deposition process. The solid-phase dopant source layer may be, for example, an oxide containing a dopant. For the n-type device, the solid-phase dopant source layer may contain an n-type dopant, such as PSG (phosphosilicate glass). For the p-type device, the solid-phase dopant source layer may contain a p-type dopant, such as BSG (borosilicate glass). The dopant in the solid-phase dopant source layer may be driven into the first source/drain layer 1003 and the second source/drain layer 1007 to form the desired source/drain doping characteristic by using an annealing process, such as a laser rapid annealing process at a temperature approximately in a range of 700° C. to 1100° C. The dopant may be driven into the first source/drain layer 1003 and the second source/drain layer 1007 mainly along the lateral direction by controlling a condition (e.g., time) of the annealing process (with inhibition of the dopant diffusion from the first source/drain layer 1003 and the second source/drain layer 1007 into the channel portion along the vertical direction). After that, the solid-phase dopant source layer may be removed.

When the in-situ doping during the growth of the first source/drain layer 1003 and the second source/drain layer 1007 meets the performance requirements of the device, an additional doping process may not be required.

Next, the spacer 1015 may be used to define of the active region.

Figure 8A:
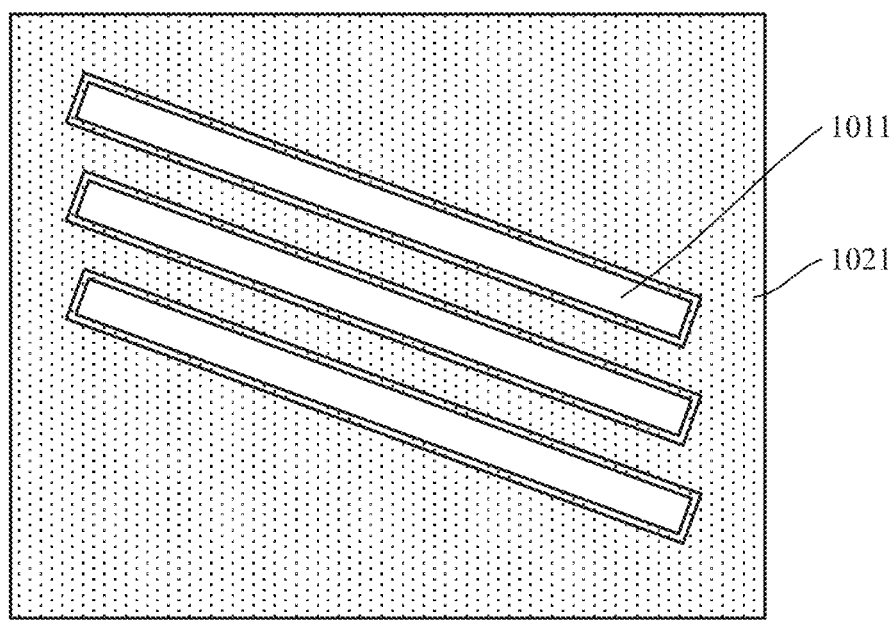
Figure 8B:
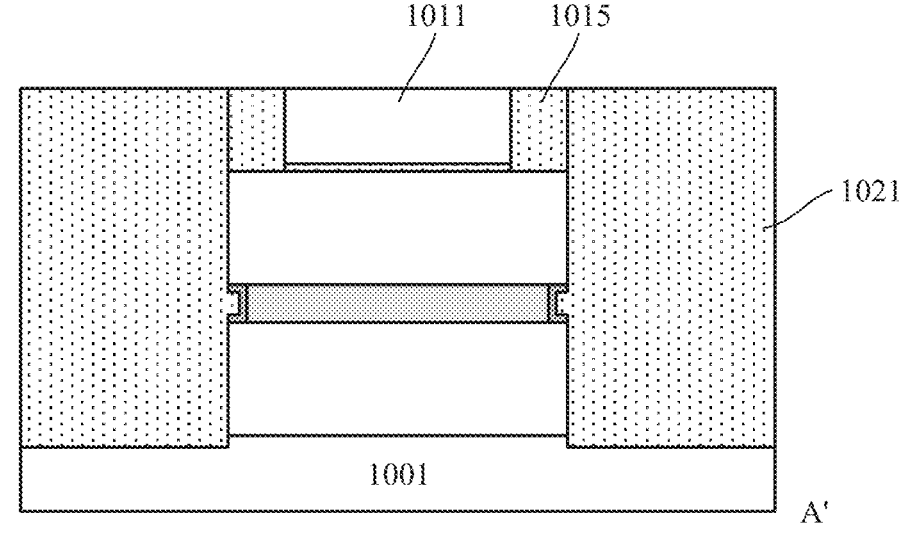

As shown in FIG. 8(*a*) and FIG. 8(*b*), a dielectric layer 1021 may be formed on the substrate 1001. For example, an oxide (for example, with a thickness approximately in a range of 300 nm to 1500 nm) that is thick enough to completely cover the ridge structure may be formed by using a deposition process. Then, a planarization process, such as a chemical mechanical polishing (CMP) process, may be performed on the deposited oxide to remove the hard mask layer 1013, so that the mandrel pattern 1011 is exposed. Before the oxide is deposited, the position retaining layer 1019 may also be removed by using a selective etching process. Thus, the recessed portion is also filled with the dielectric layer 1021. The dielectric layer 1021 helps the exposure of the mandrel pattern 1011 through the planarization, and (a part of) the dielectric layer 1021 may also act as an isolation layer in a subsequent process.

In the figures, in order to clearly show a position of the spacer 1015 (to facilitate an understanding of a region where the active region is located), an interface between the spacer 1015 and the dielectric layer 1021 is still shown. However, in this example, since the spacer 1015 and the dielectric layer 1021 are all oxides, the interface between the spacer 1015 and the dielectric layer 1021 may be vague actually.

Figure 9:
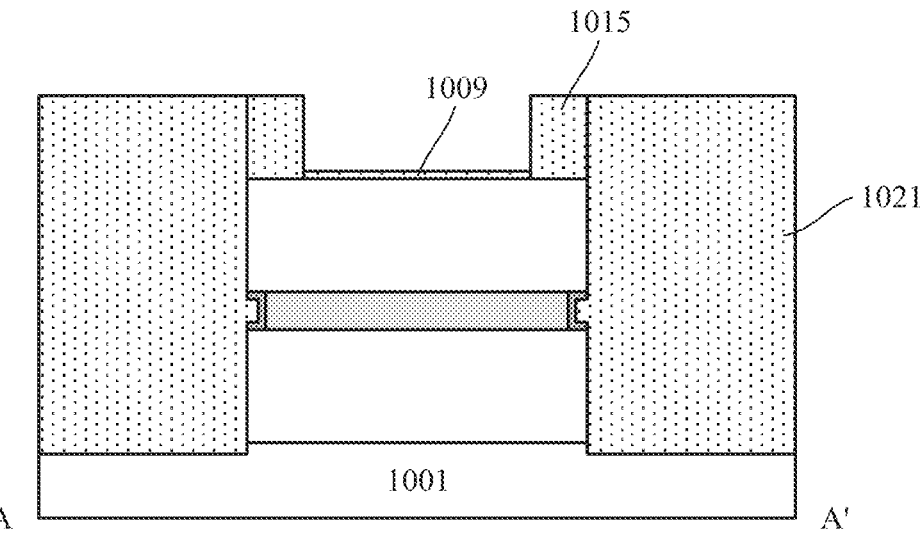

As shown in FIG. 9, the mandrel pattern 1011 may be removed by using a selective etching process, such as a wet etching process using a TMAH (Tetramethylammonium hydroxide) solution (where the etching stops at the etching stop layer 1009). In this way, the spacer 1015 in a shape of a closed loop is formed on the ridge structure.

Figure 10:
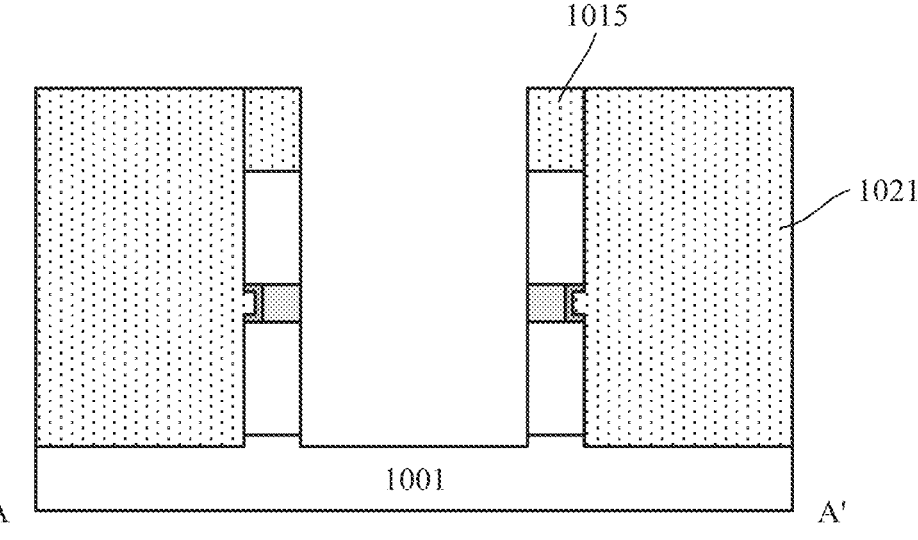

As shown in FIG. 10, the spacer 1015 may be used as an etching mask to selectively etch the etching stop layer 1009, the second source/drain layer 1007, the channel defining layer 1005 and the first source/drain layer 1003 sequentially by, for example, RIE in the z direction. Here, although both the spacer 1015 and the etching stop layer 1009 are oxides, since the etching stop layer 1009 is thin, it is feasible to retain the spacer 1015 and remove the etching stop layer 1009. In this way, under the spacer 1015, the first source/drain layer 1003, the channel defining layer 1005, the second source/drain layer 1007 and the active layer 1017 form a closed loop structure corresponding to the spacer 1015, so as to define the active region. Here, likewise, an over-etching of the substrate 1001 may occur, and an over etching depth may be, for example, approximately in a range of 10 nm to 100 nm (the over-etching amounts on inner and outer sides of the spacer 1015 may be substantially the same).

Figure 11:
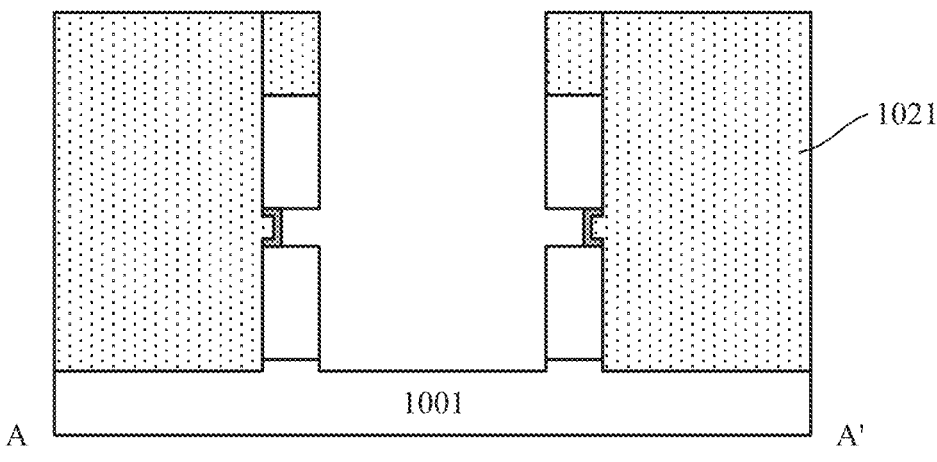

By far, an inner side of the active layer 1017 is covered by the channel defining layer 1005. The channel defining layer 1005 (which is made of SiGe in this example) may be removed by selective etching with respect to the substrate 1001, the first source/drain layer 1003, the active layer 1017 and the second source/drain layer 1007 (which are all made of Si in this example), so as to make room for the gate stack on the inner side of the active layer 1017, as shown in FIG. 11.

Figure 12:
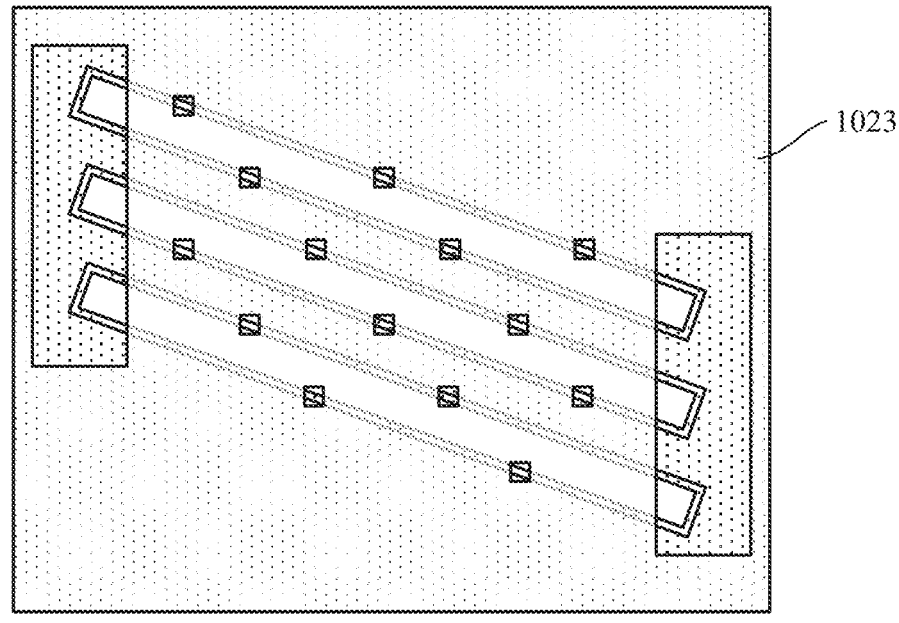

By far, the active region extends continuously in a shape of the closed loop. Separation of the active region may be performed, so that the continuously extending active region may be divided into active regions corresponding to different devices. For example, as shown in FIG. 12, a photoresist 1023 may be formed on the substrate 1001 and patterned to expose the region required to be separated by using a photolithography process (where a minimum layout CD may be approximately in a range of 20 nm to 100 nm). Here, each of the substantially parallel long sides of the loop-shaped structures is used to from a device, so as to form a regular storage unit array. Therefore, the photoresist 1023 may expose end portions of each loop-shaped structure in a longitudinal direction (where the end portion at which a short side is located is not used to form a device), as well as local regions of the long side, so as to divide the long side into several segments. These segments may have substantially the same longitudinal extension length (i.e., a distance of the photoresist 1023 between two adjacent openings on the same long side), so that devices subsequently formed based on these segments (except the segments near the end portions, which may have inconsistent lengths due to the inclined layout, and may be dummy and not used to form a device) may have substantially the same size. In this example, the photoresist 1023 is formed with large rectangular openings at the end portions and small rectangular openings between the end portions. Considering a formation of the following WL, the small rectangular openings may be arranged in columns in the y direction, and the columns are spaced apart in the x direction.

Figure 13A:
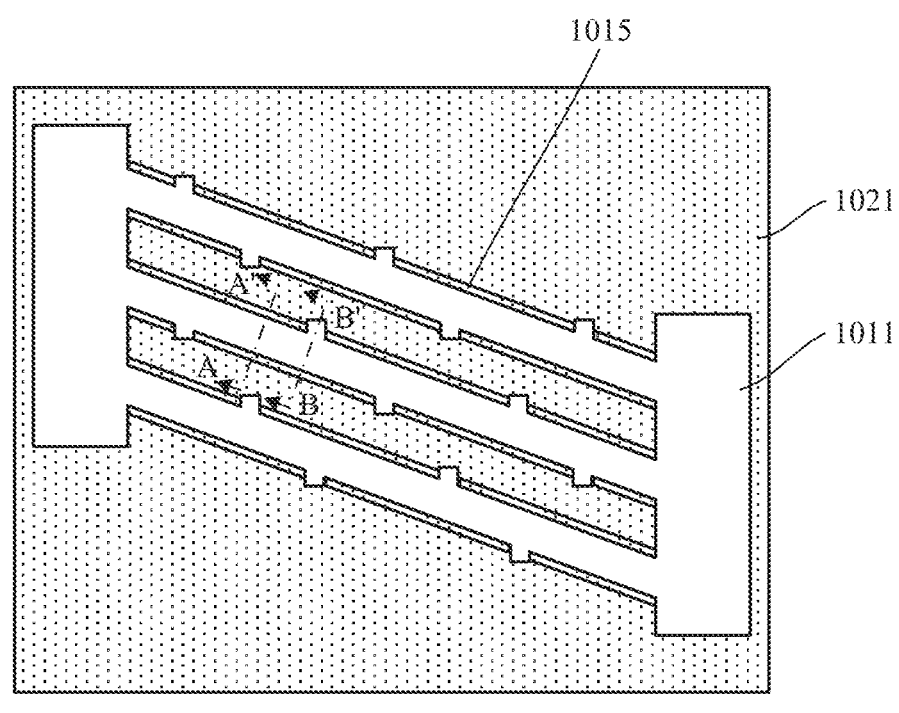
Figure 13B:
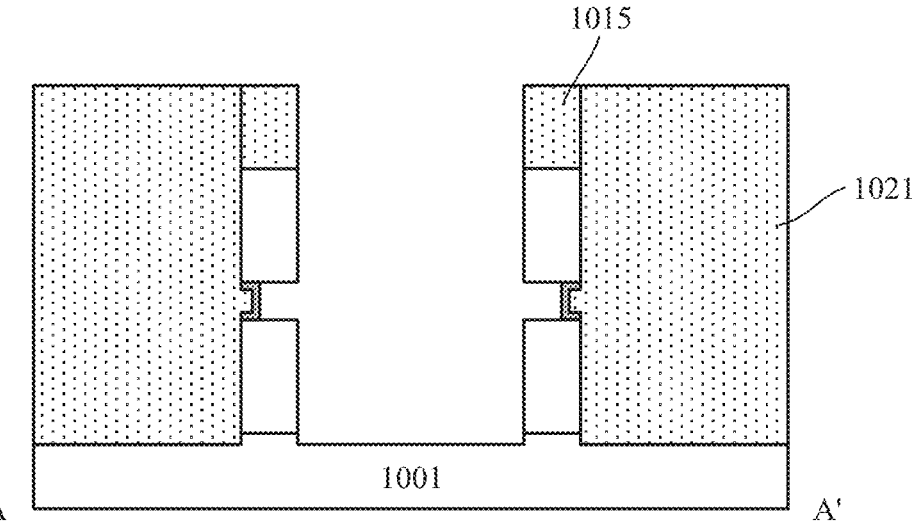
Figure 13C:
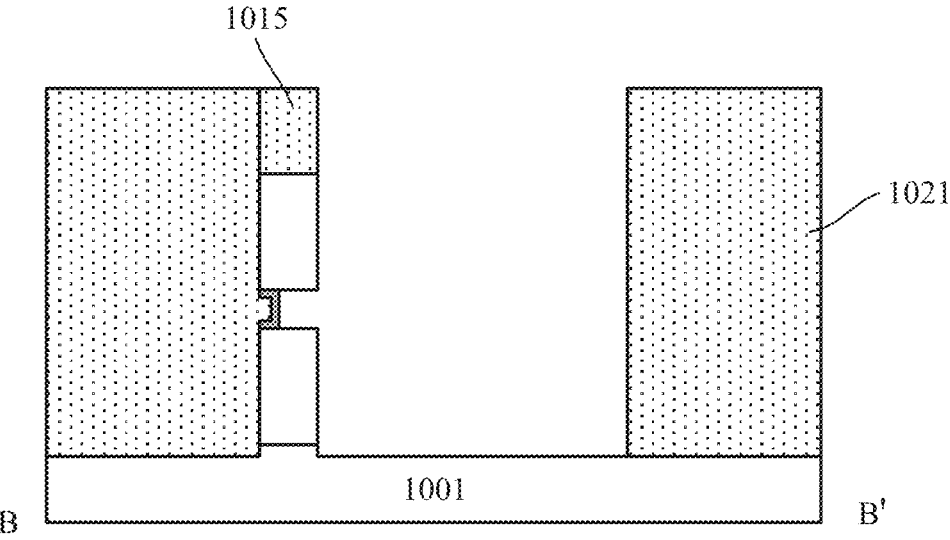
FIG. 13(c) shows a sectional view taken along the line BB'.

As shown in FIG. 13(*a*), FIG. 13(*b*) and FIG. 13(*c*), the spacer 1015 (and the dielectric layer 1021), the second source/drain layer 1007, the active layer 1017 and the first source/drain layer 1003 in regions exposed by the openings of the photoresist 1023 may be removed by using selective etching processes, such as RIE processes in the z direction. Likewise, an over-etching of the substrate 1001 may occur, and an over etching depth may be, for example, approximately in a range of 10 nm to 100 nm. In this way, as shown in FIG. 13(*c*), each long side is broken in the regions exposed by the openings of the photoresist 1023, and is separated into segments spaced apart from each other. As shown in FIG. 13(*b*), each segment includes a vertical stack of the first source/drain layer 1003, the active layer 1017 and the second source/drain layer 1007 (with the spacer 1015 disposed on the top).

For each segment, the first source/drain layer 1003 may be partially exposed to facilitate the subsequent formation of electrical contact which extends from the BL to the exposed portion. According to the embodiments of the present disclosure, in order to save area, two devices may be formed based on a same segment, and the two devices may share a same BL contact plug. In view of this, the first source/drain layer 1003 may be exposed in an approximate middle portion of each segment.

Figure 14:
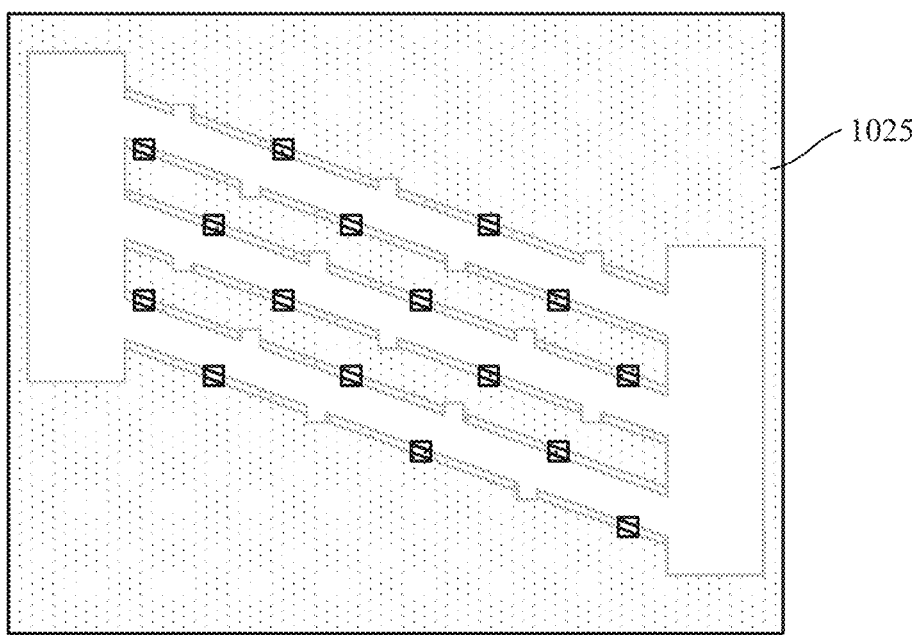

For example, as shown in FIG. 14, a photoresist 1025 may be formed on the substrate 1001 and patterned to expose a region where the first source/drain layer 1003 is required to be exposed by using a photolithography process (which may have a minimum layout CD, for example, approximately in a range of 20 nm to 100 nm). Here, the photoresist 1025 may expose the approximate middle portion of each segment in the longitudinal direction (so that each segment may be divided into two sub segments). For example, the openings in the photoresist 1025 may be between adjacent openings from the previously formed openings of the photoresist 1023 in a direction of the long side, so that these sub segments may have substantially the same longitudinal extension length. Likewise, rectangular openings may be formed in the photoresist 1025. Considering the formation of the following BL, the rectangular openings may be arranged in rows in the x direction, and the rows may be spaced apart in the y direction.

Figure 15A:
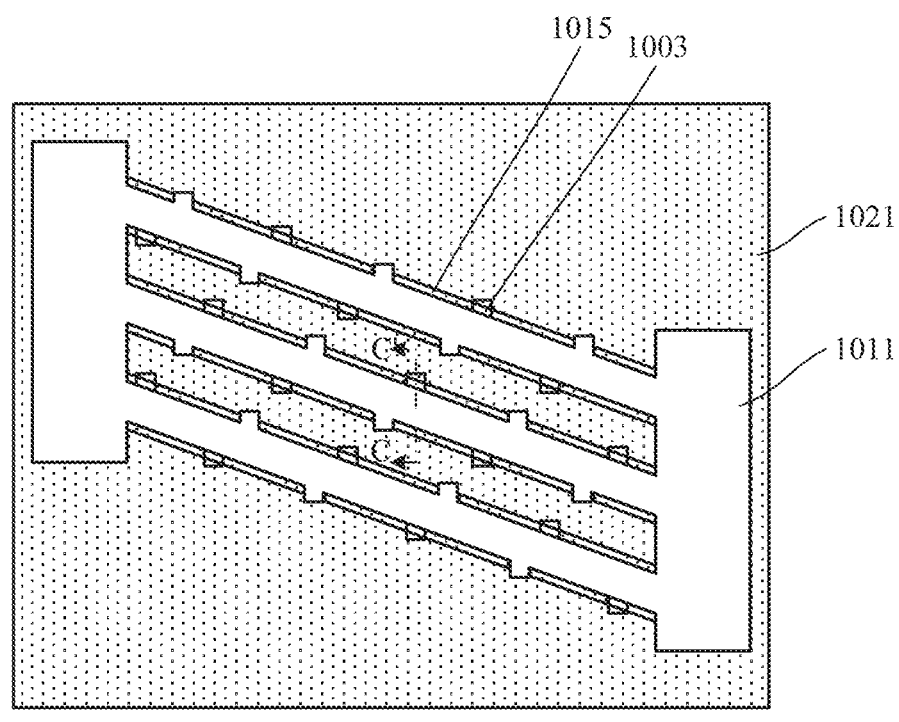
Figure 15B:
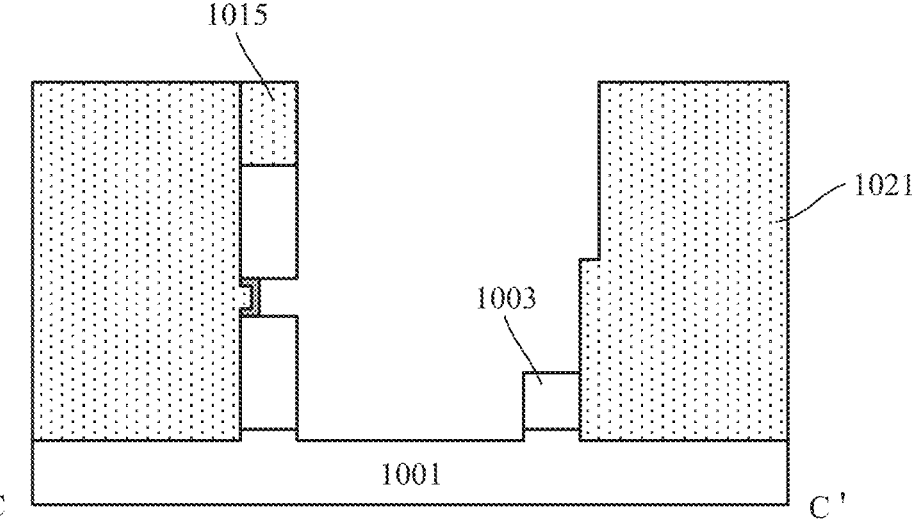
FIG. 15(b) shows a sectional view taken along the line CC'.

As shown in FIG. 15(*a*) and FIG. 15(*b*), the spacer 1015 (together with a part of the dielectric layer 1021), the second source/drain layer 1007 and the active layer 1017 in the region exposed by the opening of the photoresist 1025 may be removed by a selective etching process, such as RIE in the z direction. In addition, an upper portion of the first source/drain layer 1003 may also be removed. For example, the first source/drain layer 1003 may be etched by approximately 10% to 50% of its thickness. In this way, as shown in FIG. 15 (*b*), in the region exposed by the opening in the photoresist 1025, the active layer on the top of the first source/drain layer 1003 is removed, which may facilitate the subsequent formation of the electrical contact between the BL and the first source/drain layer 1003.

So far, the active region of each device has been defined. Specifically, each sub segment in each segment may be used to form a single switching device, and a storage unit (e.g., the switching device plus a data storage structure) may be formed based on each switching device. Here, each sub segment in each segment may be used as an active region of a switching device. However, the present disclosure is not limited thereto. For example, each segment may be used as an active region of a switching device. In this case, a portion of the first source/drain layer may be exposed at one end of each segment in the longitudinal extension direction by a method similar to those described in combination with FIG. 14, FIG. 15(*a*) and FIG. 15(*b*), and then the BL contact plug may be fabricated on the exposed portion of the first source/drain layer.

Figure 16A:
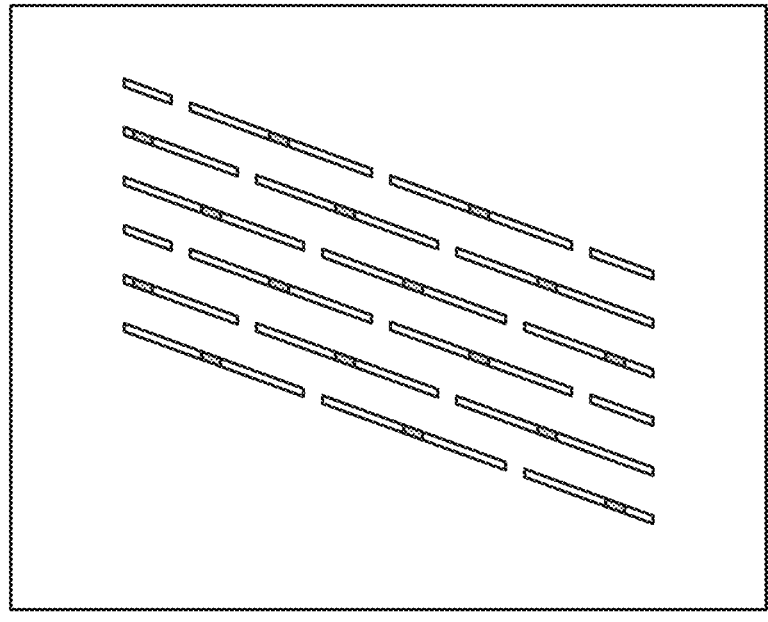
Figure 16B:
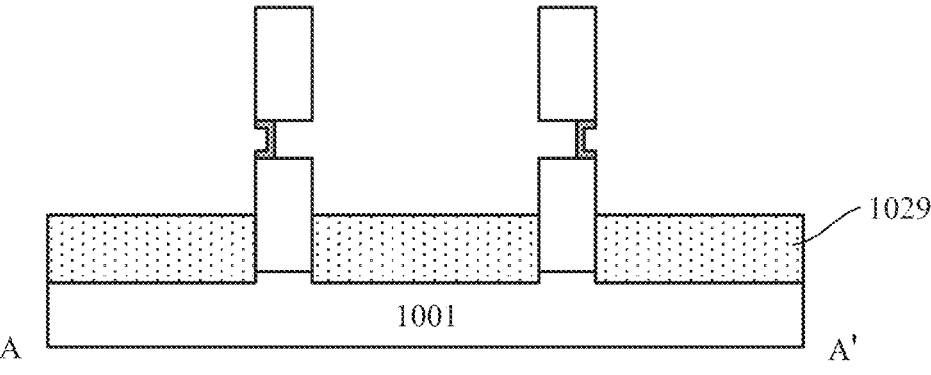

An isolation layer for electrical isolation may be formed on the substrate. For example, as shown in FIG. 16(*a*) and FIG. 16(*b*), an oxide (e.g., with a thickness approximately in a range of 300 nm to 1500 nm) which is thick enough to cover the active region may be formed on the substrate by deposition, such as CVD. Then, a planarization process, such as a CMP process, may be performed on the deposited oxide. The oxide after the planarization (together with the previously formed spacer 1015 and dielectric layer 1021 which are also oxides) may be etched back by wet etching (e.g., using HF acid) or dry etching, retaining a certain thickness of oxide on the substrate 1001 as an isolation layer 1029. For example, a top surface of the isolation layer 1029 may be 10 nm to 150 nm lower than a bottom of the channel portion (or a top surface of the first source/drain layer 1003).

In the top view of FIG. 16 (*a*), the isolation layer 1029 is not shown for the sake of clarity. As clearly shown in FIG.

16 (*a*), active regions of a plurality of device (corresponding to the "sub segments" described above) extending in a line shape are formed on the substrate, where the active regions are inclined with respect to the y direction. For each pair of adjacent device active regions, the first source/drain layer of one of the adjacent device active regions may be connected to the other one of the adjacent device active regions in the longitudinal extension direction (thus corresponding to the "segment" described above), and the first source/drain layers are exposed in middle portions (the darker portions shown in FIG. 16 (*a*), which are defined by the photoresist 1025 described above). The isolation between the active regions of the respective pairs of devices (i.e., the spacing between the respective segments) in the longitudinal extension direction may be defined by the photoresist 1023 described above.

The gate stack may be formed on the isolation layer 1029. According to the embodiments of the present disclosure, the gate stack may be formed together with the WL, so as to simplify the process, thereby reducing the costs.

Figure 17:
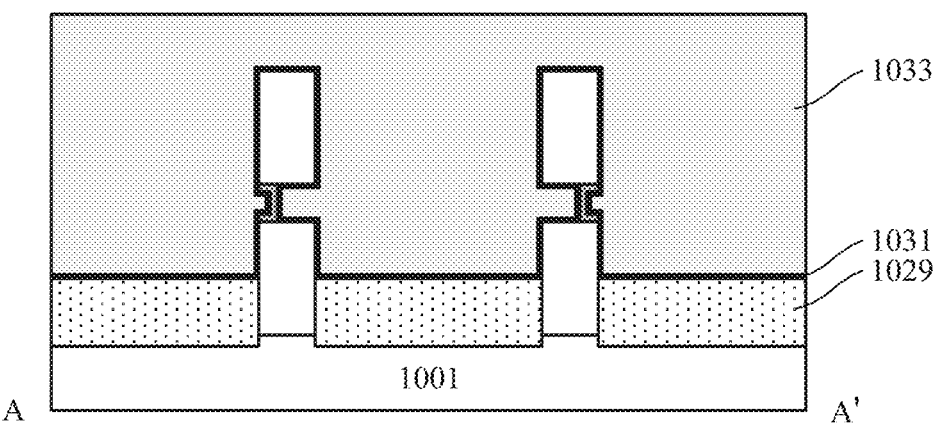

For example, as shown in FIG. 17, a substantially conformal gate dielectric layer 1031 may be formed on the isolation layer 1029 by deposition, and a gate conductor layer 1033 may be formed on the gate dielectric layer 1031. For example, the gate dielectric layer 1031 may include a high-k gate dielectric such as $HfO_2$ with a thickness, for example, approximately in a range of 1 nm to 10 nm. Before forming the high-k gate dielectric, an interface layer may also be formed, which may be an oxide formed by, for example, an oxidation process, or a deposition process such as Atomic Layer Deposition (ALD). The gate conductor layer 1033 may include: a work function adjustment metal such as TiN, with a thickness, for example, approximately in a range of 1 nm to 10 nm; and a gate conductive metal such as W, with a thickness, for example, approximately in a range of 100 nm to 800 nm. A planarization process, such as CMP, may be performed on the gate conductor layer 1033, and a space between the active regions of each device may be filled with the gate conductor layer 1033. In this way, the formed gate stack (the gate dielectric layer 1031 plus the gate conductor layer 1033) may be embedded between the first source/drain layer 1003 and the second source/drain layer 1007, surrounding the channel layer 1017.

So far, the fabrication of the switching device in the storage unit has been basically completed. Next, various interconnection structures such as the WL and the BL, and the data storage structure (e.g., a capacitor) may be formed.

The WL may be formed based on the gate stack, especially the gate conductor layer 1033 therein.

Figure 18:
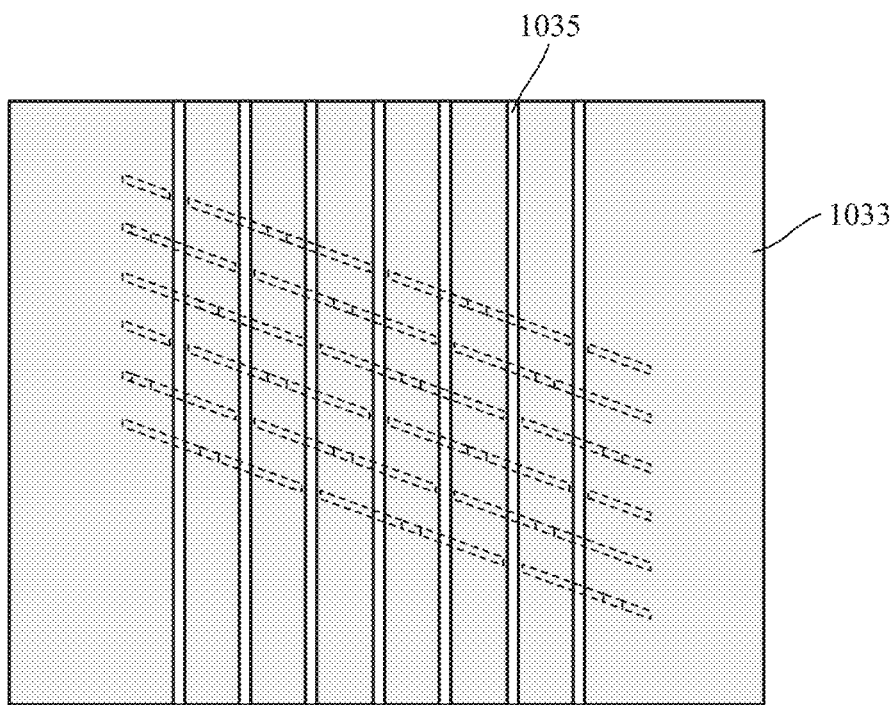

For example, as shown in FIG. 18, a photoresist 1035 may be formed on the gate conductor layer 1033 and patterned into a pattern corresponding to the WL (in this example, a series of strips in the y direction are taken as an example) by photolithography (where the minimum size of the layout CD may be approximately in a range of 10 nm to 50 nm). These strips may extend in the y direction to pass through a gap (corresponding to the opening in the photoresist 1023) between the segments described above, and may be spaced apart in the x direction, so that the active region of each device (corresponding to each sub segment described above) intersects with a single strip (corresponding to a single WL).

Figure 19A:
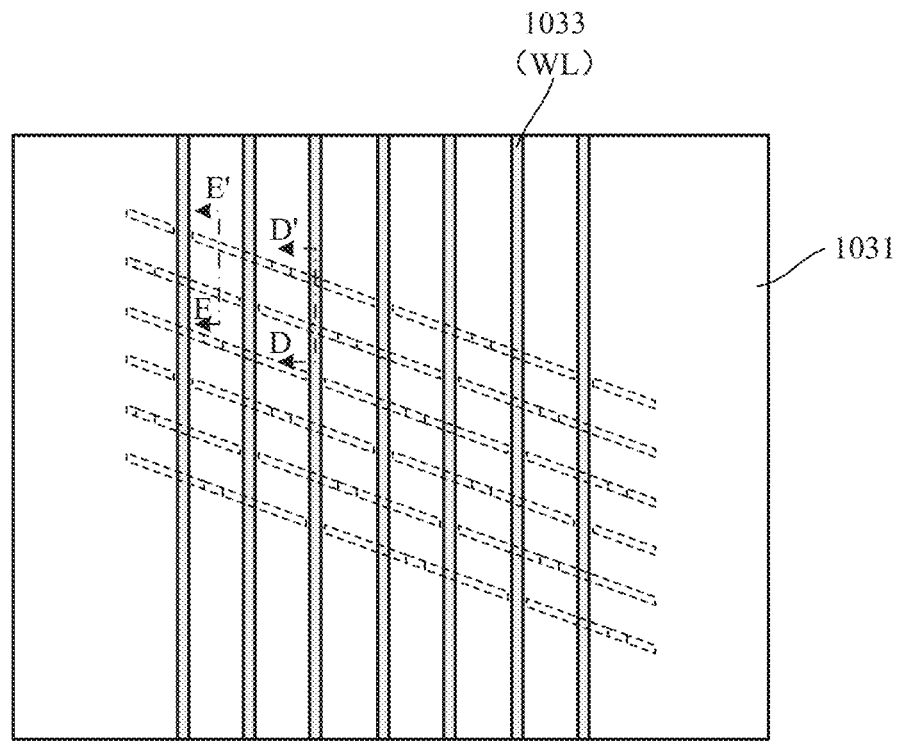
Figure 19B:
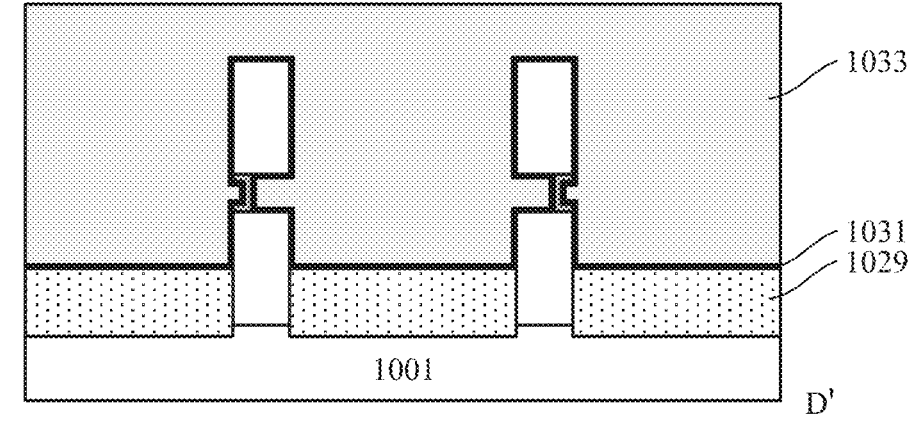
FIG. 19(b) shows a sectional view taken along the line DD'.
Figure 19C:
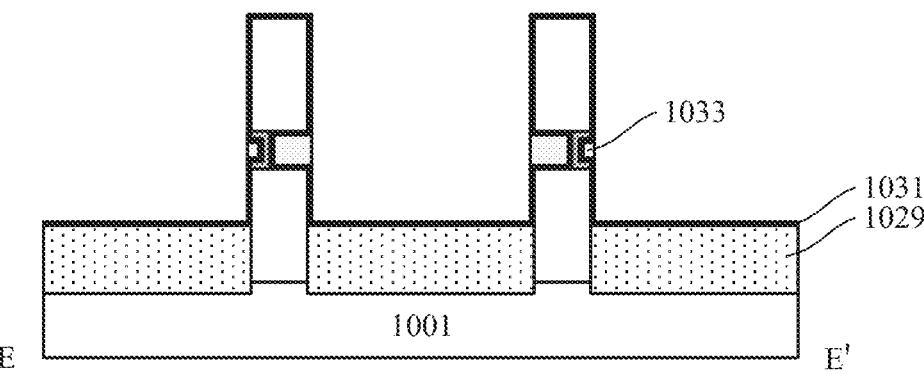
FIG. 19(c) shows a sectional view taken along the line EE'.

As shown in FIG. 19(*a*), FIG. 19(*b*) and FIG. 19(*c*), the gate conductor layer 1033 may be selectively etched by, for example, RIE in the z direction using the photoresist 1035 as the etching mask, so as to pattern the gate conductor layer 1033 into the WL corresponding to the pattern of the photoresist 1035. The etching may stop at the gate dielectric layer 1031. As shown in FIG. 19(*c*), the gate conductor layer 1033 may be retained in a gap between the first source/drain layer 1003 and the second source/drain layer 1007 and therefore may be disposed on the inner and outer sides of the channel layer 1017 in a self-aligned manner, so as to form a double gate configuration. Here, as shown in FIG. 19(*b*), at the WL, a top surface of the gate conductor layer 1033 is higher than a top surface of the active region of the device (i.e., a top surface of the second source/drain layer 1007), so that the gate stacks on the inner and outer sides of the channel layer 1017 may be electrically connected to each other. Accordingly, a single device (corresponding to the sub segment) may be electrically connected to the single WL (in fact, the gate conductor layer of the device is integral with the WL corresponding to the gate conductor layer).

For clarity, in the top view shown FIG. 19 (*a*), the gate dielectric layer 1031 is not represented in black as shown in the sectional view of FIG. 19 (*b*).

Although the WL is formed by the gate conductor layer, the present disclosure is not limited thereto. For example, the gate conductor layer 1033 may be selectively etched, such as by using RIE in the z direction, without a process of forming an additional etching mask. In this way, the gate conductor layer 1033 may be retained only in the gap between the first source/drain layer 1003 and the second source/drain layer 1007. Then, an additional conductive layer may be formed and patterned by using the photoresist 1035, so as to form the WL. The WL may extend across sub segments corresponding to the WL and be in contact with the sub segments, so as to be electrically connected to gate stacks on opposite sides of the sub segment.

As shown in FIG. 19(*a*), FIG. 19(*b*) and FIG. 19(*c*), the storage unit may include the first source/drain layer 1003, the channel layer 1017 and the second source/drain layer 1007 sequentially stacked in the vertical direction. The channel layer 1017 may be in a shape of a nanosheet or nanowire. The gate stack is between the first source/drain layer 1003 and the second source/drain layer 1007 in the vertical direction, and sandwiches the channel layer 1017 from the opposite sides of the channel layer 1017 (in the fourth direction). The active region (which is the stack of the first source/drain layer 1003, the channel layer 1017 and the second source/drain layer 1007), especially the channel layer 1017 therein, may extend in the third direction inclined with respect to the first direction (i.e., an extension direction of the WL), so that a width of the channel may be increased and the on-current may be thus increased.

Figure 20A:
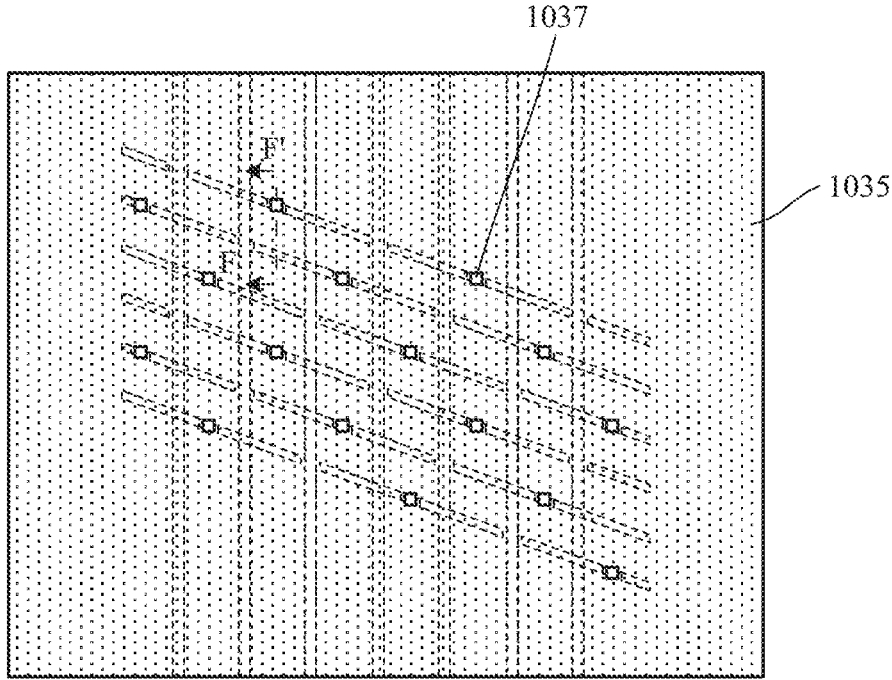
Figure 20B:
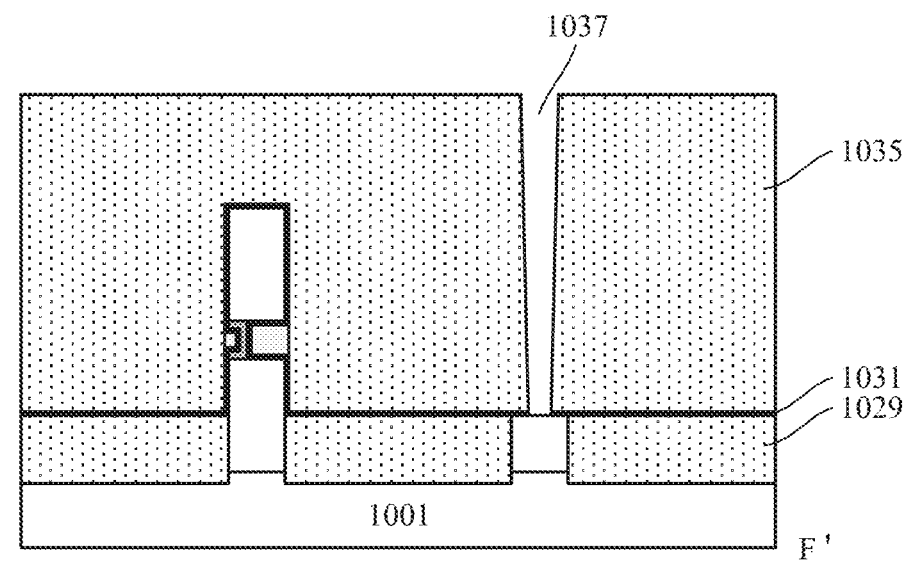
FIG. 20(b) and FIG. 21(b) show sectional views taken along the line FF'.

As shown in FIG. 20(*a*) and FIG. 20(*b*), an interlayer dielectric layer 1035 may be formed on the isolation layer 1029. For example, an oxide approximately in a range of 50 nm to 100 nm may be deposited, for example, by using CVD, and a planarization process such as CMP may be performed on the deposited oxide, so as to form the interlayer dielectric layer 1035. Before forming the interlayer dielectric layer 1035 which is the oxide, a nitride liner (not shown) with a thickness, for example, approximately in a range of 10 nm to 30 nm may be formed. In the interlayer dielectric layer 1035, a BL contact hole 1037 may be formed by photolithography. As shown in FIG. 20(*b*), BL contact holes 1037 are disposed between the active regions of the respective devices (each of which corresponds to a position between two sub segments of a same segment described above and is defined by the opening in the photoresist 1025), so as to expose the first source/drain layer 1003.

In FIG. 20(*b*), a top surface of the first source/drain layer 1003 at a location between two sub segments in each segment is shown to be flush with the top surface of the isolation layer 1029. However, this is only shown schematically for the convenience of illustration. Depending on the etching amount, the top surface of the first source/drain layer 1003 may be protruded or recessed with respect to the top surface of the isolation layer 1029.

Figure 21A:
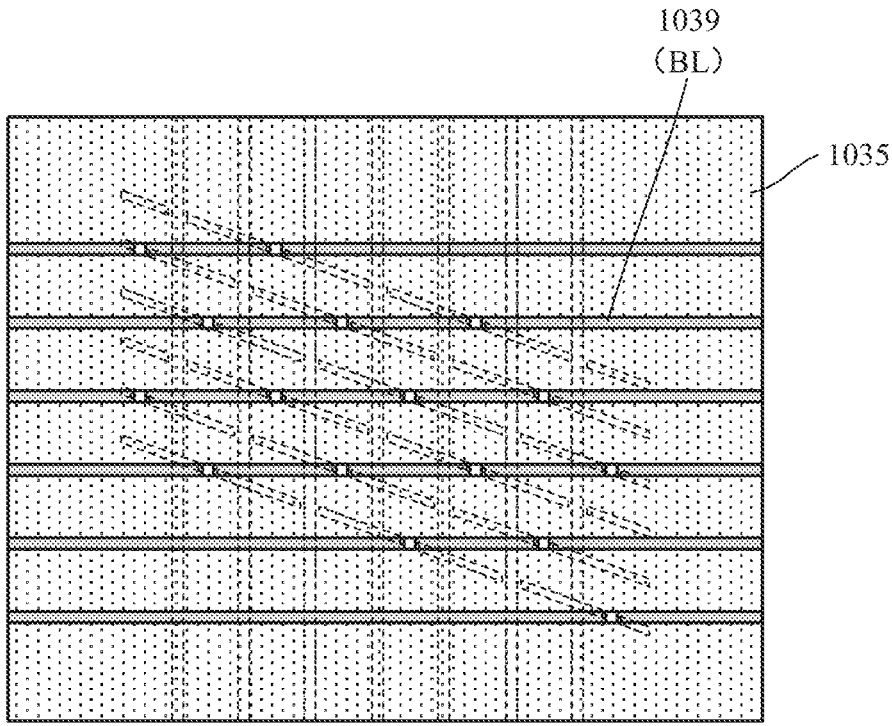
Figure 21B:
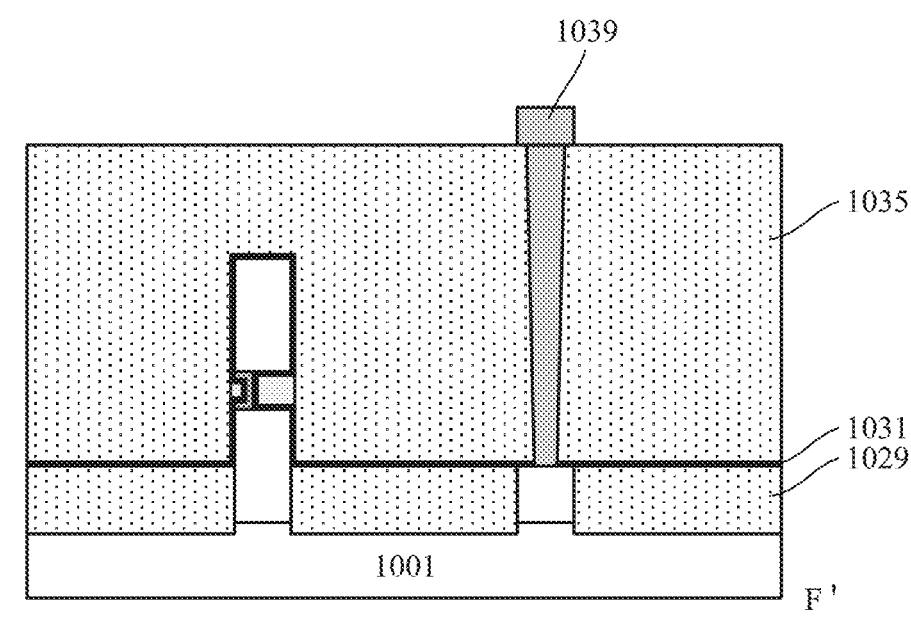

As shown in FIG. 21(*a*) and FIG. 21(*b*), the BL contact holes may be filled with a conductive material to form the BL contact plugs. In addition, a conductive material may be formed on the interlayer dielectric layer 1035 by deposition and then etched, so as to form the BLs 1039. The BLs 1039 may extend in the x direction and may be spaced apart from each other in the y direction, so that each BL contact plug is electrically connected to a respective one of the BLs. As shown in FIG. 21(*a*) and FIG. 21(*b*), two adjacent devices (corresponding to two sub segments of a same segment) in the longitudinal extension direction may share a same BL contact plug and thus be electrically connected to the same BL, so that the number of BL contact plugs may be reduced.

Each BL contact plug (a small block on the BL), which is actually obscured by the BL and is not visible, is shown in the top view of FIG. 21 (*a*) for the sake of clarity.

Figure 22A:
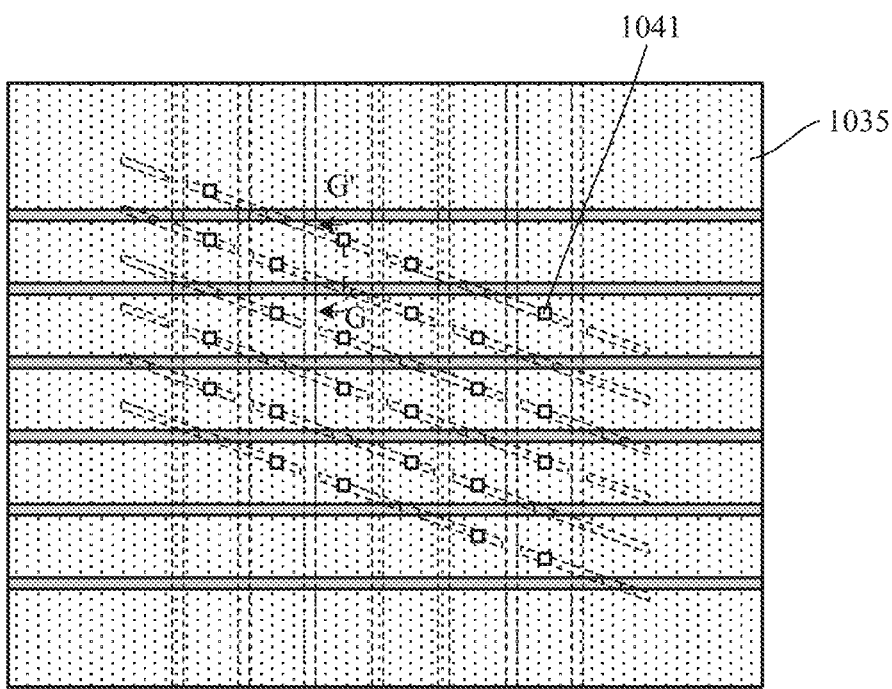
Figure 22B:
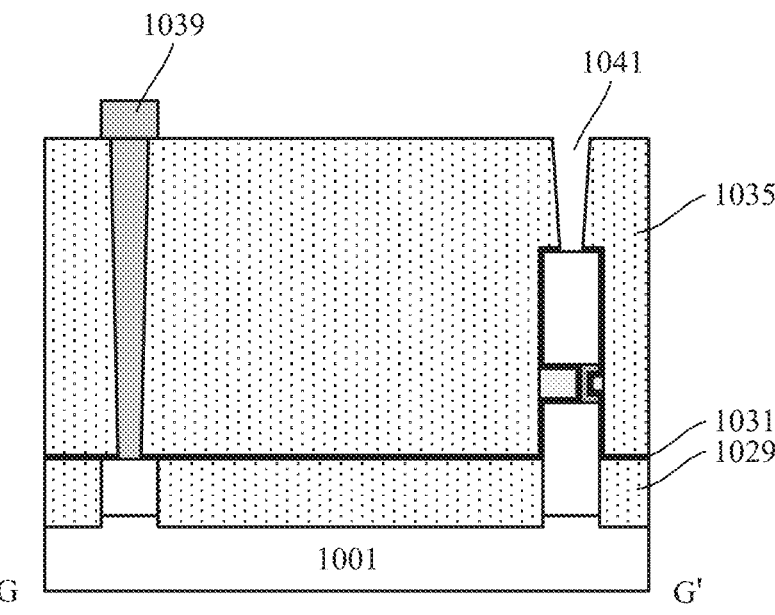
FIG. 22(b) shows a sectional view taken along the line GG'.

In addition, as shown in FIG. 22(*a*) and FIG. 22(*b*), capacitive contact holes 1041 may be formed in the interlayer dielectric layer 1035 by photolithography. The capacitive contact holes 1041 may be disposed in the active regions of the respective devices (corresponding to the respective sub segments described above, which are regions between the openings in the photoresist 1023 and the openings in the photoresist 1025 in each long side described above), so as to expose the second source/drain layer 1007.

Figure 23:
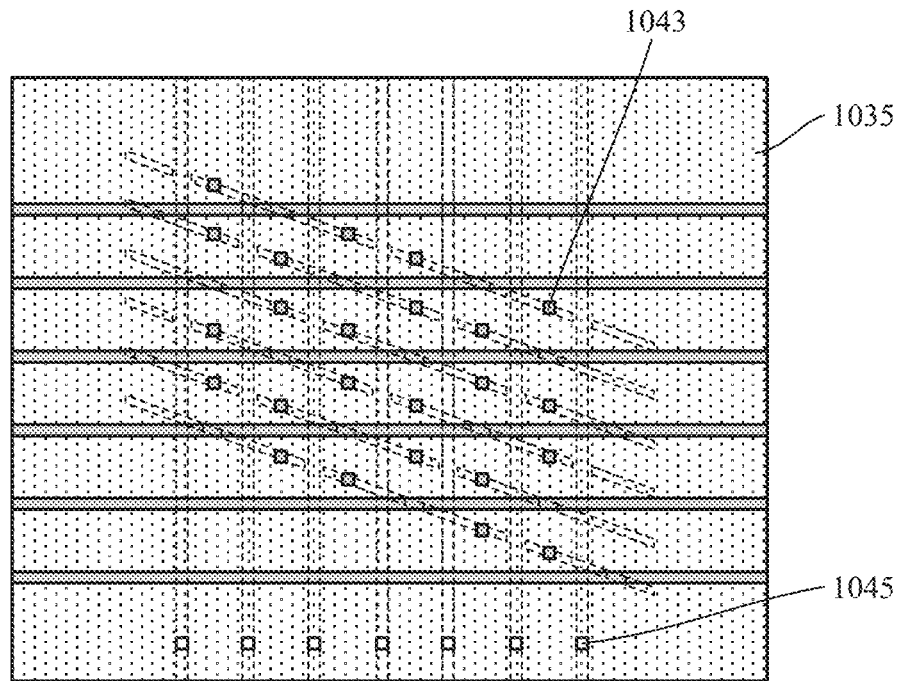

As shown in FIG. 23, the capacitive contact holes 1041 may be filled with a conductive material to form capacitive contact plugs 1043. The capacitive contact plugs 1043 may electrically connect capacitors (not shown) subsequently formed on the interlayer dielectric layer 1035 to the second source/drain layers 1007 of the respective devices.

Likewise, in the interlayer dielectric layer 1035, WL contact holes may be formed by photolithography and filled with a conductive material to form WL contact plugs 1045. The respective WL contact plugs 1045 are located above the WLs, so as to be in contact with the WLs and thus are electrically connected to the WLs.

It will be worth noting that the above etching processes for the interlayer dielectric layer 1035, which are for forming the BL contact hole, the capacitive contact hole and the WL contact hole, are performed respectively, due to different etching depths of the etchings. The etching processes may be performed in an order different from the order described above.

Subsequently, a later stage process may be performed, which will not be repeated here.

The storage device according to the embodiments of the present disclosure may be applied to various electronic devices. For example, the electronic device may include the storage device and a processor. The storage device may store data required for the operation of the electronic device or data obtained during the operation. The processor may operate based on the data and/or applications stored in the storage device. The electronic device may include, for example, a smart phone, a personal computer (PC), a tablet computer, a wearable intelligence device, an artificial intelligence device, a portable power source, and so on.

In the above description, the technical details such as patterning and etching of each layer are not described in detail. However, those skilled in the art should understand that various technical means may be used to form layers, regions, etc. of desired shapes. In addition, in order to form the same structure, those skilled in the art may further design a method that is not completely the same as the method described above. In addition, although the various embodiments are described above separately, this does not mean that the measures in the various embodiments may not be advantageously used in combination.

The embodiments of the present disclosure have been described above. However, these embodiments are for illustration only, and are not intended to limit the scope of the present disclosure. The scope of the present disclosure is defined by the appended claims and their equivalents. Without departing from the scope of the present disclosure, those skilled in the art may make various substitutions and modifications, and these substitutions and modifications shall all fall within the scope of the present disclosure.

What is claimed is:

1. A storage device, comprising:
a substrate;
a plurality of word lines extending in a first direction on the substrate;
a plurality of bit lines extending in a second direction perpendicular to the first direction on the substrate; and
a storage unit array disposed on the substrate, wherein the storage unit array comprises a plurality of storage units, each of which is electrically connected to a respective one of the plurality of word lines and a respective one of the plurality of bit lines,
wherein each of the storage units comprises:
an active region, wherein the active region extends in a third direction inclined with respect to the first direction and comprises a vertical stack of a first source/drain layer, a channel layer and a second source/drain layer; and
gate stacks between the first source/drain layer and the second source/drain layer in a vertical direction, wherein the gate stacks are disposed on opposite sides of the channel layer in a fourth direction orthogonal to the third direction, so as to sandwich the channel layer,
wherein a respective word line corresponding to each storage unit extends across the storage unit in the first direction to be in contact with and electrically connected to the gate stacks on opposite sides of the storage unit, and
wherein the first direction, the second direction and the third direction are parallel to a same plane.

2. The storage device according to claim 1, wherein the third direction is at an angle in a range of 30 degrees to 80 degrees with respect to the first direction.

3. The storage device according to claim 1, wherein the gate stack comprises a gate dielectric layer and a gate conductor layer on the gate dielectric layer, wherein the gate conductor layer is integral with the word line corresponding to the gate conductor layer.

4. The storage device according to claim 3, further comprising:
an isolation layer on the substrate, wherein the gate stack is disposed on the isolation layer,
wherein the gate dielectric layer extends onto a surface of the isolation layer, a surface of the first source/drain layer, and a surface of the second source/drain layer.

5. The storage device according to claim 1, wherein in the storage unit array, the plurality of storage units are arranged along parallel lines extending in the third direction.

6. The storage device according to claim 5, wherein for each pair of adjacent storage units in the third direction, the first source/drain layer of a first one of the adjacent storage units is integral with the first source/drain layer of a second one of the adjacent storage units; and
the storage device further comprises a bit line contact plug disposed on the first source/drain layer in a region between each pair of storage units, wherein the bit line contact plug is in contact with and electrically connected to the bit line corresponding to the bit line contact plug.

7. The storage device according to claim 6, wherein in the storage unit array, two storage units in each pair of storage units are respectively arranged on opposite sides of the bit line corresponding to the two storage units in the first direction.

8. The storage device according to claim 1, wherein a width of the first source/drain layer in the fourth direction is in a range of 30 nm to 200 nm, a width of the second source/drain layer in the fourth direction is in a range of 30 nm to 200 nm, and a thickness of the channel layer in the fourth direction is in a range of 5 nm to 50 nm.

9. The storage device according to claim 1, wherein the third direction is along a specific crystal face.

10. The storage device according to claim 9, wherein the crystal face comprises a (100) crystal face.

11. A method for manufacturing a storage device, comprising:
providing a vertical stack extending in a third direction between a first direction and a second direction on a substrate, wherein the vertical stack comprises a first source/drain layer, a channel layer and a second source/drain layer stacked sequentially, and the first direction and the second direction are perpendicular to each other;
dividing the vertical stack into a plurality of segments in the third direction;
defining a plurality of storage units based on the plurality of segments;
forming a plurality of word lines extending in the first direction on the substrate, wherein each of the word lines extends across a respective storage unit of the plurality of storage units in the first direction and is electrically connected to gate stacks of the respective storage unit; and
forming a plurality of bit lines extending in the second direction on the substrate, wherein each of the bit lines is electrically connected to a respective storage unit of the plurality of storage units;
wherein the first direction, the second direction and the third direction are parallel to a same plane.

12. The method according to claim 11, wherein the defining a plurality of storage units based on the plurality of segments comprises:
removing the second source/drain layer and the channel layer in a middle region of each of the plurality of segments in the third direction to expose the first source/drain layer,
wherein each of portions of each segment on opposite sides of the middle region in the third direction defines a storage unit.

13. The method according to claim 12, further comprising:
forming a bit line contact plug connected to the first source/drain layer in the middle region,
wherein the bit line contact plug extends from the first source/drain layer to a respective one of the plurality of bit lines.

14. The method according to claim 12, wherein, recessed portions are defined between the first source/drain layer and the second source/drain layer of each of the storage units, wherein the recessed portions are located on opposite sides of the channel layer in a fourth direction orthogonal to the third direction; and the forming a plurality of word lines extending in the first direction comprises:

forming a gate dielectric layer and a gate conductor layer sequentially, wherein the recessed portions are filled with the gate dielectric layer and the gate conductor layer to form the gate stacks; and patterning the gate conductor layer as the word lines extending in the first direction, wherein the gate conductor layer in the recessed portions of each of the storage units is continuous with a respective one of the word lines.

15. The method according to claim 11, wherein the third direction is at an angle in a range of 30 degrees to 80 degrees with respect to the first direction.

16. The method according to claim 11, wherein the providing a vertical stack on a substrate comprises:

forming a stack of the first source/drain layer, the channel defining layer and the second source/drain layer on the substrate;

forming a mandrel pattern extending in the third direction on the stack;

forming a spacer on sidewalls of the mandrel;

patterning the stack into a ridge structure in the third direction by using the mandrel pattern and the spacer as an etching mask;

selectively etching the channel defining layer such that the channel defining layer is laterally recessed with respect to the first source/drain layer and the second source/drain layer;

forming a channel layer on a sidewall of the channel defining layer by using an epitaxial growth process;

removing the mandrel pattern, and patterning the stack into a linear shape by using the spacer as an etching mask; and removing the channel defining layer.

17. An electronic device, comprising the storage device according to claim 1.

18. The electronic device according to claim 17, wherein the electronic device comprises a smart phone, a computer, a tablet computer, a wearable device, an artificial intelligence device, and a portable power source.

\* \* \* \* \*